United States Patent
Tada et al.

(10) Patent No.: US 7,923,384 B2
(45) Date of Patent: Apr. 12, 2011

(54) FORMATION METHOD OF POROUS INSULATING FILM, MANUFACTURING APPARATUS OF SEMICONDUCTOR DEVICE, MANUFACTURING METHOD OF SEMICONDUCTOR DEVICE, AND SEMICONDUCTOR DEVICE

(75) Inventors: Munehiro Tada, Tokyo (JP); Naoya Furutake, Tokyo (JP); Tsuneo Takeuchi, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 327 days.

(21) Appl. No.: 12/085,469

(22) PCT Filed: Nov. 24, 2006

(86) PCT No.: PCT/JP2006/324040
§ 371 (c)(1),
(2), (4) Date: May 23, 2008

(87) PCT Pub. No.: WO2007/061134
PCT Pub. Date: May 31, 2007

(65) Prior Publication Data
US 2009/0039474 A1    Feb. 12, 2009

(30) Foreign Application Priority Data
Nov. 24, 2005    (JP) .................................. 2005-338452

(51) Int. Cl.
*H01L 21/31*    (2006.01)
*H01L 21/469*    (2006.01)

(52) U.S. Cl. ........ 438/789; 257/635; 257/701; 257/760; 257/E21.273; 257/E21.278; 438/787; 438/788

(58) Field of Classification Search .................. 257/635, 257/701, 760, E21.273, E21.278; 438/787, 438/788, 789
See application file for complete search history.

(56) References Cited

U.S. PATENT DOCUMENTS
2005/0267253 A1* 12/2005 Hayashi ........................ 524/588

FOREIGN PATENT DOCUMENTS

| JP | 2002-526916 | 8/2002 |
|---|---|---|
| JP | 2003-297821 | 10/2003 |
| JP | 2004-200713 | 7/2004 |
| JP | 2004-289105 | 10/2004 |
| JP | 2005-166716 | 6/2005 |
| JP | 2005-203794 | 7/2005 |

* cited by examiner

*Primary Examiner* — Asok K Sarkar
(74) *Attorney, Agent, or Firm* — McGinn IP Law Group, PLLC

(57) ABSTRACT

In a formation method of a porous insulating film by supplying at least organosiloxane and an inert gas to a reaction chamber and forming an insulating film by a plasma vapor deposition method, a partial pressure of the organosiloxane in the reaction chamber is changed by varying a volume ratio of the organosiloxane and the inert gas to be supplied during deposition. Thus, the dielectric constant of the insulating film in the semiconductor device is reduced while the adhesion of the insulating film with other materials is improved. It is desirable that the organosiloxane be cyclic organosiloxane including at least silicon, oxygen, carbon, and hydrogen, and that the total pressure of the reaction chamber be constant during deposition.

33 Claims, 23 Drawing Sheets

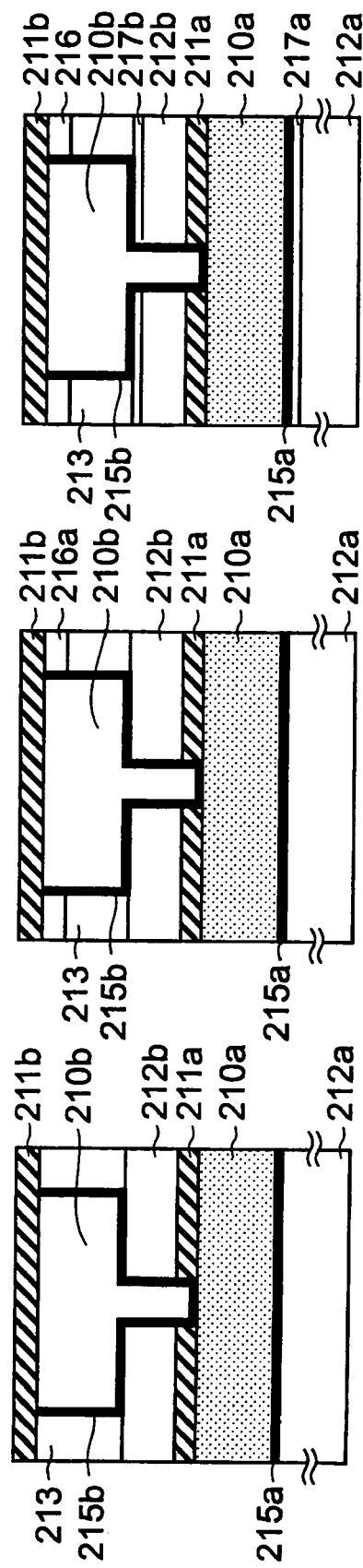

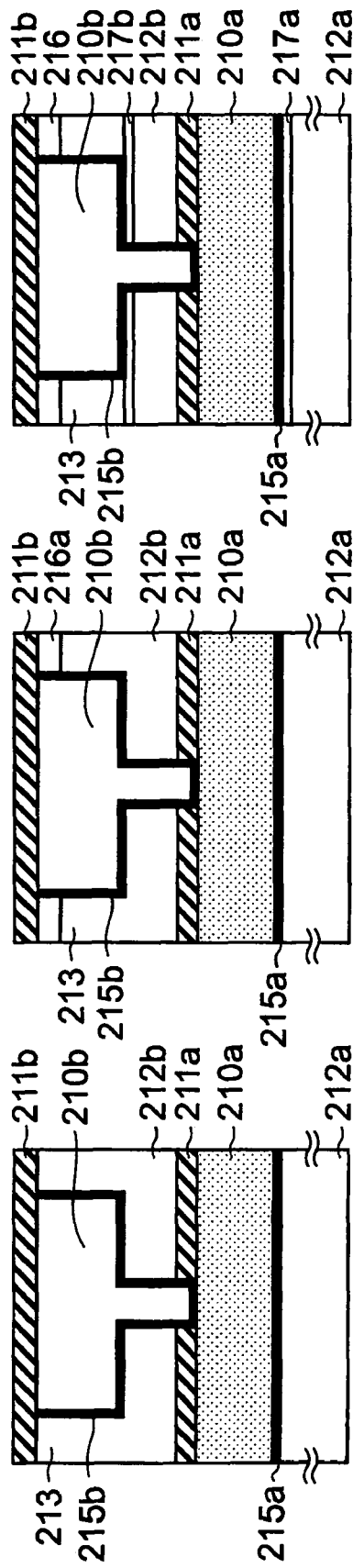

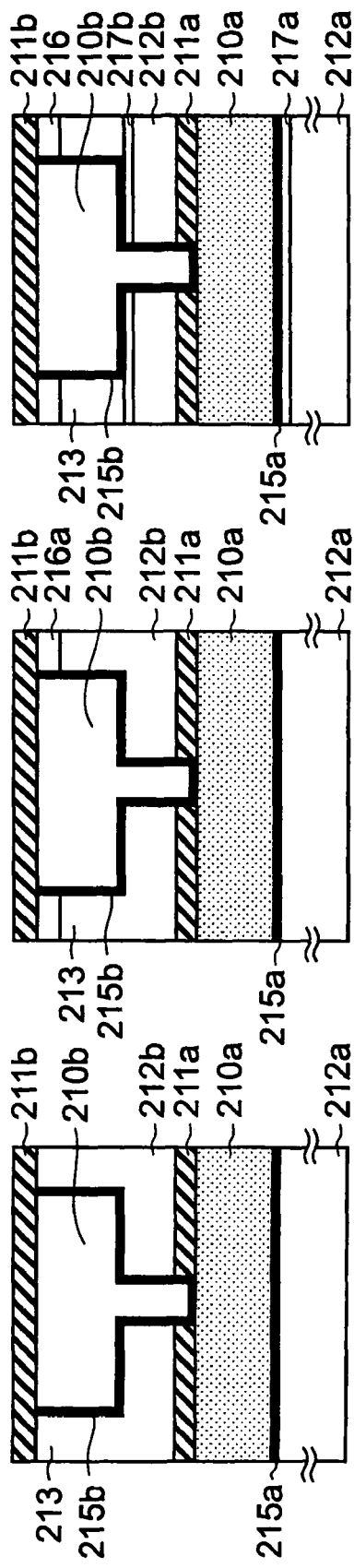

FORMATION METHOD OF POROUS INSULATING FILM, MANUFACTURING APPARATUS OF SEMICONDUCTOR DEVICE, MANUFACTURING METHOD OF SEMICONDUCTOR DEVICE, AND SEMICONDUCTOR DEVICE

TECHNICAL FIELD

The present invention relates to a formation method of a porous insulating film, and more particularly to a semiconductor device having a multilayer interconnection, a semiconductor device having a damascene interconnection structure containing Cu as a principal component, a manufacturing apparatus thereof, and a manufacturing method thereof.

BACKGROUND ART

Heretofore, aluminum (Al) or Al alloy has widely been used as a conductive material in silicon semiconductor integrated circuits (LSI). As manufacturing methods of LSIs make progress in fineness, copper (Cu) has increasingly been used as a conductive material to reduce the wiring resistance of interconnections and to enhance the reliability of interconnections. Cu readily diffuses into a silicon oxide film. Accordingly, a conductive barrier metal film for preventing Cu from diffusing is used on side surfaces and lower surfaces of Cu interconnections, and an insulating barrier film is used on upper surfaces of Cu interconnections.

The recent development of the fineness in LSIs has further reduced the interconnection dimension, so that an increase of the capacity between interconnections has been problematic. Therefore, porous low-dielectric-constant films have increasingly been introduced to interlayer dielectrics for the following reason. Because high-speed and low-power connection is required in a case where multilayer interconnections are used in a semiconductor device, reduction of the dielectric constant of interlayer dielectrics is effective in addition to the improvement of the fineness. It has been desired to meet both of these demands.

In order to reduce an effective capacity between interconnections, reduction of the dielectric constant of interlayer dielectrics (to a dielectric constant lower than that of a silicon oxide film (k=4.2)) has been required. Examples of low-dielectric-constant films include an HSQ (Hydrogen Silsesquioxane) film, a CDO (Carbon doped oxide) or organic film, and the like. Those low-dielectric-constant films are formed by a spin-coating method, a vapor phase method, or the like.

Japanese laid-open patent publication No. 2004-289105 (Patent Document 1) discloses a technique of forming a porous insulating film by using a plasma CVD method. Published Japanese patent translation No. 2002-526916 (Patent Document 2) discloses a technique of forming a porous insulating film by using cyclic organosiloxane. Japanese laid-open patent publication No. 2004-200713 (Patent Document 3) discloses a technique of changing the total pressure of a reaction chamber so as to improve the adhesion of an insulating film.

DISCLOSURE OF INVENTION

Problems to be Solved by the Invention

In the prior art, as described in the aforementioned documents, a porous insulating film having a relative dielectric constant of about 2.6 can be formed by a plasma CVD method using a raw material of organosiloxane. However, the recent improvement of the fineness in LSIs has required a method of forming a porous insulating film having a relative dielectric constant not more than 2.4. Particularly, it has been desired to form a porous insulating film having excellent adhesion by a plasma CVD method. However, the prior art has the following problems.

(1) The technology described in Patent Document 1 is a cutting-recombination type deposition method in which raw material monomers are decomposed in plasma. This method has a problem that the relative dielectric constant cannot be reduced because hydrocarbon components that have been bonded to raw material monomers are detached from the monomers. The limitation of the relative dielectric constant that can be achieved has been about 2.6.

(2) With the technology using raw material monomers of cyclic siloxane as described in Patent Document 2, the cyclic structure of siloxane serves as a skeleton. As a result, it is possible to obtain a relative dielectric constant of about 2.4. However, this technology has a problem that the adhesion at interfaces to different kinds of materials deteriorates as the relative dielectric constant is reduced. Thus, it has been desired to establish a method of forming a porous insulating film having a low relative dielectric constant with high adhesion.

(3) With the technology using raw material monomers of cyclic siloxane as described in Patent Document 3, an adhesion layer having high strength can be formed by changing the total pressure of a reaction chamber However, the changes of the total pressure of the reaction chamber greatly vary the distribution of the grown film thickness of an insulating film within the wafer. Therefore, the partial pressure of the raw material cannot be changed in a wide range. As a result, there is a problem that the adhesion cannot be improved.

Accordingly, an object of the present invention is to reduce the dielectric constant of an insulating film in a semiconductor device and improve the adhesion between the insulating film and other materials. The present invention provides a formation method of a porous insulating film, a manufacturing apparatus of a semiconductor device, a manufacturing method of a semiconductor device, and a semiconductor device which are suitable for this object.

Means for Solving the Problems

The inventors of the present invention examined formation methods of a porous insulating film and, as a result, have found a novel formation method of a porous insulating film. Specifically, it is possible to form a multilayered insulating film structure and ensure high adhesion with maintaining a low dielectric constant of the entire film by the following method: a formation method of a porous insulating film by supplying at least organosiloxane and an inert gas to a reaction chamber and forming an insulating film by a plasma vapor deposition method, characterized in that: a partial pressure of the organosiloxane in the reaction chamber is changed by varying a volume ratio of the organosiloxane and the inert gas to be supplied during deposition.

The multilayered insulating film structure means that, upon forming a porous insulating film, a layer having different film characteristics is formed at least on an upper surface or a lower surface of the porous insulating film. The layer having different film characteristics can be formed in a range of about 1 nm to about 200 nm. When the layer is thin, it may be used as an adhesion layer. When the layer is thick, it may be used as one layer of an insulating film. The characteristics of the multilayered insulating film vary continuously.

The above is based on the fact that the inventors have found that the partial pressure of a raw material can be controlled by varying a volume ratio of cyclic organosiloxane and an inert gas without changing the total pressure of a reaction chamber and that the characteristics of a porous insulating film can accordingly be controlled.

In the present invention, cyclic organosiloxane or non-cyclic organosiloxane (e.g., straight-chain organosiloxane or the like) can be used. Nevertheless, it is desirable that the organosiloxane be cyclic organosiloxane including at least silicon, oxygen, carbon, and hydrogen and that the total pressure of the reaction chamber be constant during deposition.

FIG. 1 is a graph showing partial-pressure-of-cyclic-organosiloxane dependency of properties of films deposited at 230° C. by using a raw material having a structure expressed by the following chemical structure formula (4) as cyclic organosiloxane and He as an inert gas and varying a volume ratio of the cyclic organosiloxane and He. It can be seen that both of the relative dielectric constant k and the refractive index n became lowered as the partial pressure of the raw material increased.

Here, evaluation was conducted on three films having different relative dielectric constants. Table 1 shows the results of measurement of compositions in the films with RBS/HFS (Rutherford Backscattering Spectrometry/Hydrogen Forward scattering Spectrometry). It can be seen that a film having a lower relative dielectric constant k could be obtained as the density of the film became lowered and its composition became closer to the composition of the raw material.

TABLE 1

|  | Si | O | C | H | Density g/cm³ |
|---|---|---|---|---|---|
| k = 2.6 | 1 | 1.77 | 3.11 | 5.36 | 1.20 |
| k = 2.5 | 1 | 1.13 | 3.11 | 5.45 | 1.12 |
| k = 2.45 | 1 | 1.09 | 3.16 | 6.19 | 1.06 |
| Raw material of chemical structure formula (4) | 1 | 1 | 5 | 10 | — |

FIG. 2 shows spectra in Raman spectroscopic analysis, and FIG. 3 shows the relative comparison results of the bond strength. It can be seen that the films had more CH groups and C—C—C groups so that they were closer to the structure of the raw material as the relative dielectric constant k was reduced.

Next, FIG. 4 shows the results of evaluation on the adhesion of the obtained films by employing the m-ELT (modified Edge Lift-off Test) test. It can be seen that the adhesion of the film was improved with the increase of the relative dielectric constant k.

FIG. 5 shows the relationships between the partial pressure of the raw material and the self-bias of the showerhead (Vdc) and between the partial pressure of the raw material and the relative dielectric constant k at 230° C. It can be seen that Vdc and the relative dielectric constant k became lowered as the partial pressure of the raw material increased. As shown in the upper right of FIG. 5, it is considered that the electron temperature is lowered due to the shortened mean free path because generated electrons are more likely to collide with molecules of the raw material as the partial pressure of the raw material increases. It is considered that a film having a low relative dielectric constant k can be obtained as a result of the fact that decomposition of the raw material is suppressed by the lowered electron temperature.

Additionally, as shown in the lower right of FIG. 5, because the mean free path of electrons in the plasma is long in a low partial pressure region of the raw material, the plasma can readily be ignited. Accordingly, it is possible to improve the unstableness in initializing the plasma and reduce the plasma damage to an underlying device.

Thus, it is apparent that control of the partial pressure of the raw material and stable deposition can be achieved by varying a volume ratio of a raw material gas of cyclic organosiloxane and an inert gas. By using such dependency of the film characteristics on the partial pressure of a raw material, it is possible to obtain a stable film having a low dielectric constant and high adhesion with maintaining the uniformity of the film thickness within a wafer.

According to the present invention, a partial pressure of a raw material can be controlled to a large degree by varying a volume ratio of cyclic organosiloxane and an inert gas, not varying a total pressure of a reaction chamber. Therefore, the total pressure of the reaction chamber can be fine adjusted, as needed, in consideration of the uniformity of the film thickness within a wafer.

Furthermore, in order to reduce the relative dielectric constant, the raw material of cyclic organosiloxane preferably has a skeleton of a three-membered ring structure including Si—O and more preferably has a structure expressed by the following chemical structure formula (1). It is preferable that R1 and R2 are one of a methyl group, an ethyl group, a propyl group, an isopropyl group, a vinyl group, and an allyl group. More specifically, it is preferable that the organosiloxane has a structure expressed by either of the following chemical structure formulas (2)-(4).

Chemical structure formula (1):

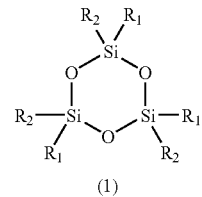

(1)

Chemical structure formula (2):

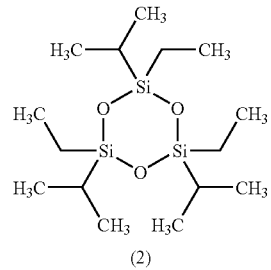

(2)

Chemical structure formula (3):

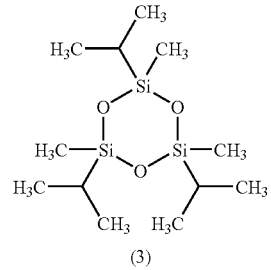

(3)

-continued

Chemical structure formula (4):

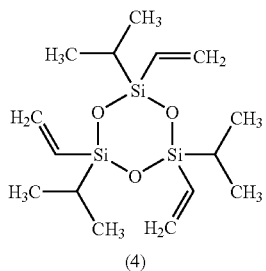

(4)

When the film has such a three-membered ring structure including Si—O, the density of the film is lowered. Accordingly, the relative dielectric constant of the film can be reduced. Furthermore, if an unsaturated bond is included as a side chain, addition reaction is promoted so as to improve a deposition rate. Thus, it is possible to form a porous film having a mesh network structure.

Moreover, it is preferable that the inert gas is at least one of He, Ne, Ar, Kr, Xe, and Rn.

A specific example of the partial pressure change of cyclic organosiloxane during plasma excitation includes (i) a process to excite plasma and (ii) a process to maintain the plasma, wherein the partial pressure of the organosiloxane in (ii) the process to maintain the plasma is higher than that in (i) the process to excite the plasma. Thus, it is possible to form a layer having high adhesion at a lower layer portion of the porous insulating film so as to ensure the adhesion with an underlying layer.

On the other hand, in order to ensure the adhesion with an overlying layer, in the formation method of a porous insulating film, (ii) a process to maintain plasma and (iii) a process to extinguish the plasma are included, wherein the partial pressure of the organosiloxane in (ii) the process to maintain the plasma is higher than that in (iii) the process to extinguish the plasma. Thus, it is possible to form an upper layer of the porous insulating film with high adhesion so as to ensure the adhesion with the overlying layer.

In order to ensure the adhesion with the overlying and underlying layers, in the formation method of a porous insulating film, (i) a process to excite plasma, (ii) a process to maintain the plasma, and (iii) a process to extinguish the plasma are included, wherein the partial pressure of the organosiloxane in (ii) the process to maintain the plasma is higher than that in the other processes. Thus, it is possible to form upper and lower layers of the porous insulating film with high adhesion so as to ensure the adhesion with the overlying and underlying layers.

Specifically, it is preferable that a volume ratio of the organosiloxane to the inert gas in at least (ii) the process to maintain the plasma is not less than 0.1. Furthermore, it is preferable that a volume ratio of the organosiloxane to the inert gas in at least (i) the process to excite the plasma or (iii) the process to extinguish the plasma is less than 0.1.

Here, as another specific example of the partial pressure change of organosiloxane, it is preferable that the partial pressure of the organosiloxane is controlled by changing a flow rate of the inert gas. Furthermore, for example, it is preferable that the partial pressure of the organosiloxane is controlled by changing a flow rate of the raw material of organosiloxane.

Moreover, to further improve the adhesion, for example, it is preferable that the partial pressure of the organosiloxane is controlled by supplying an addition gas to the reaction chamber. Here, for example, it is preferable that the addition gas comprises at least one of methanol, ethanol, propanol, and isopropanol. Since such a gas serves as an oxidant, it functions to improve a growth rate of the insulating film and to stabilize the plasma. Furthermore, for example, it is preferable that the addition gas comprises at least one of $O_2$ and $CO_2$. When such an oxidant is introduced, detachment of hydrocarbon components is promoted so as to make it possible to obtain a film having fewer hydrocarbon components with excellent adhesion. Moreover, for example, it is preferable that the addition gas comprises at least one of $N_2O$, $H_2O$, and $SiH_4$. When such an addition gas is introduced, the density of electrons generated in the plasma is increased so as to make it possible to improve a growth rate of the insulating film without largely changing the relative dielectric constant. For example, it is preferable that the addition gas comprises at least one of ethylene, acetylene, cyclohexane, benzene, trimethylbenzene, and naphthalene. If the carrier gas employs He, for example, the inert gas may employ Ar, Ne, Xe, Kr, Rn, or the like.

In order to further improve the adhesion, for example, it is preferable that an applied power is varied in synchronism with the variation of the volume ratio of the organosiloxane and the inert gas.

Here, as a specific example of the change of the power, it is preferable that plasma power in (ii) the process to maintain the plasma is lower than that in the other processes.

In order to further improve the adhesion, it is preferable that a low-frequency power is applied to a substrate in at least (i) the process to excite the plasma or (iii) the process to extinguish the plasma.

In order to solve the above problems, a semiconductor device manufacturing apparatus according to the present invention comprises a microcomputer programmed to change a partial pressure of organosiloxane in a reaction chamber by varying a volume ratio of the organosiloxane and an inert gas during deposition.

In a manufacturing method of a semiconductor device having at least one circuit element formed in a semiconductor substrate or a semiconductor layer and a multilayer interconnection structure formed on the semiconductor substrate or the semiconductor layer in a state in which the multilayer interconnection structure is electrically connected to the at least one circuit element, where the semiconductor device has a multilayer interconnection formed by stacking plural unit interconnection layer structures each of which has an interconnection and a connecting plug formed by filling metal wiring in an interconnection trench and a via hole formed in an insulating film, in order to solve the above problems, a manufacturing method of a semiconductor device according to the present invention is characterized by supplying at least organosiloxane and an inert gas to a reaction chamber, forming the insulating film by a plasma vapor deposition method, and varying a volume ratio of the organosiloxane and the inert gas to be supplied during deposition to change a partial pressure of the organosiloxane in the reaction chamber; and forming a lower adhesion layer of an interconnection interlayer dielectric in a process to excite plasma, forming the interconnection interlayer dielectric in a process to maintain the plasma, and forming an upper adhesion layer of the interconnection interlayer dielectric in a process to extinguish the plasma.

In a manufacturing method of a semiconductor device having at least one circuit element formed in a semiconductor substrate or a semiconductor layer and a multilayer interconnection structure formed on the semiconductor substrate or the semiconductor layer in a state in which the multilayer interconnection structure is electrically connected to the at least one circuit element, where the semiconductor device has a multilayer interconnection formed by stacking plural unit interconnection structures each of which has an interconnection and a connecting plug formed by filling metal wiring in an interconnection trench and a via hole formed in an insulating film, in order to solve the above problems, a manufacturing method of a semiconductor device according to the present invention is characterized by a process to form a via interlayer dielectric, a process to form an interconnection interlayer dielectric, and a process to form a hard mask film; and supplying at least organosiloxane and an inert gas to a reaction chamber, forming the insulating film by a plasma vapor deposition method, and varying a volume ratio of the organosiloxane and the inert gas to be supplied during deposition to change a partial pressure of the organosiloxane in the reaction chamber; and forming the via interlayer dielectric in a process to excite plasma and forming the interconnection interlayer dielectric in a process to maintain the plasma.

The manufacturing method of a semiconductor device according to the present invention is characterized in that the hard mask film is formed in a process to extinguish the plasma.

In a semiconductor device having an insulating film formed by a plasma vapor deposition method with supplying at least a raw material of organosiloxane and an inert gas to a reaction chamber, in order to solve the above problems, a semiconductor device according to the present invention is characterized in that the insulating film is a porous film formed by a partial pressure control with varying a volume ratio of the raw material of organosiloxane and the inert gas during deposition.

The semiconductor device according to the present invention is characterized in that the porous insulating film is an insulating film including a cyclic organosiloxane structure containing at least silicon, oxygen, hydrogen, and carbon as component elements, and the film density near an interface of at least one of an upper layer and a lower layer of the insulating film is higher than that of an interior of the film and varies continuously.

The semiconductor device according to the present invention is characterized in that the amount of carbon near an interface of at least one of an upper layer and a lower layer of the porous insulating film is smaller than that of an interior of the film and varies continuously.

The semiconductor device according to the present invention is characterized in that the hydrogen content near an interface of at least one of an upper layer and a lower layer of the porous insulating film is lower than that of an interior of the film and varies continuously.

The semiconductor device according to the present invention is characterized in that: the insulating film comprises an interconnection interlayer dielectric and a via interlayer dielectric; both of the interconnection interlayer dielectric and the via interlayer dielectric include at least silicon, oxygen, carbon, and hydrogen; and the amount of oxygen in the interconnection interlayer dielectric is smaller than that in the via interlayer dielectric.

The semiconductor device according to the present invention is characterized in that: the insulating film comprises an interconnection interlayer dielectric and a via interlayer dielectric; both of the interconnection interlayer dielectric and the via interlayer dielectric include at least silicon, oxygen, carbon, and hydrogen; and the amount of carbon in the interconnection interlayer dielectric is larger than that in the via interlayer dielectric.

The semiconductor device according to the present invention is characterized in that: the insulating film comprises an interconnection interlayer dielectric and a via interlayer dielectric; both of the interconnection interlayer dielectric and the via interlayer dielectric include at least silicon, oxygen, carbon, and hydrogen; and the density of the interconnection interlayer dielectric is lower than that of the via interlayer dielectric.

The semiconductor device according to the present invention is characterized in that: the insulating film comprises an interconnection interlayer dielectric and a via interlayer dielectric; and the via interlayer dielectric comprises an SiOCH film.

The semiconductor device according to the present invention is characterized in that: the insulating film comprises an interconnection interlayer dielectric; and a hard mask film of an SiOCH film is provided above the interconnection interlayer dielectric.

The novel features of the present invention will be apparent from the description in the specification and the accompanying drawings.

EFFECTS OF THE INVENTION

With a manufacturing method of a semiconductor device according to the present invention, a semiconductor device according to the present invention, and the like, it is possible to simultaneously achieve reduction of the low dielectric constant and enhancement of the adhesion of an interlayer dielectric. Furthermore, it is possible to reduce the plasma damage to an underlying device and hence to improve the performance of the interconnections. Accordingly, it is possible to form a high-speed LSI having a low electric consumption.

BRIEF DESCRIPTION OF DRAWINGS

FIGS. 22(a), 22(b), and 22(c) are diagrams showing examples of a structure of a dual damascene interconnection formed by using a formation method of a porous insulating film according to the present invention.

FIGS. 23(a), 23(b), and 23(c) are diagrams showing other examples of the structure of the dual damascene interconnection formed by using a formation method of a porous insulating film according to the present invention.

FIGS. 24(a), 24(b), and 24(c) are diagrams showing still other examples of the structure of the dual damascene interconnection formed by using a formation method of a porous insulating film according to the present invention.

FIG. 28 is a graph showing adhesion measurement results in Example 1, Example 2, and the like.

DESCRIPTION OF REFERENCE NUMERALS AND SIGNS

Figure 1:
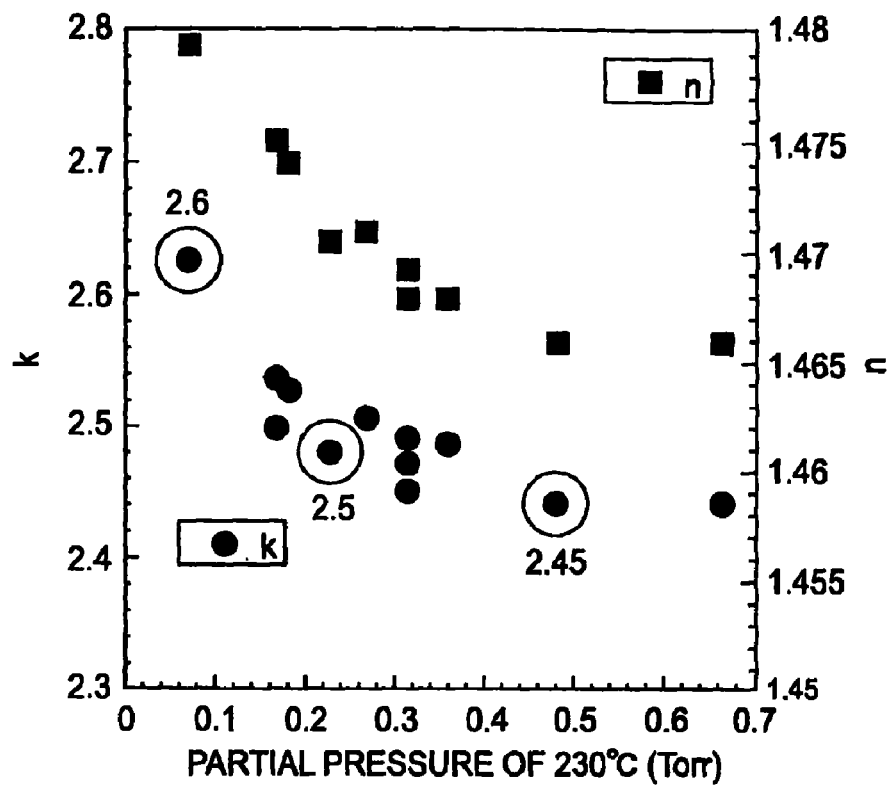
FIG. 1 is a graph showing partial-pressure-of-cyclic-organosiloxane dependency of a relative dielectric constant k and a refractive index n of samples produced by using a raw material having a structure expressed by the chemical structure formula (4) as cyclic organosiloxane and He as an inert carrier gas.
Figure 2:
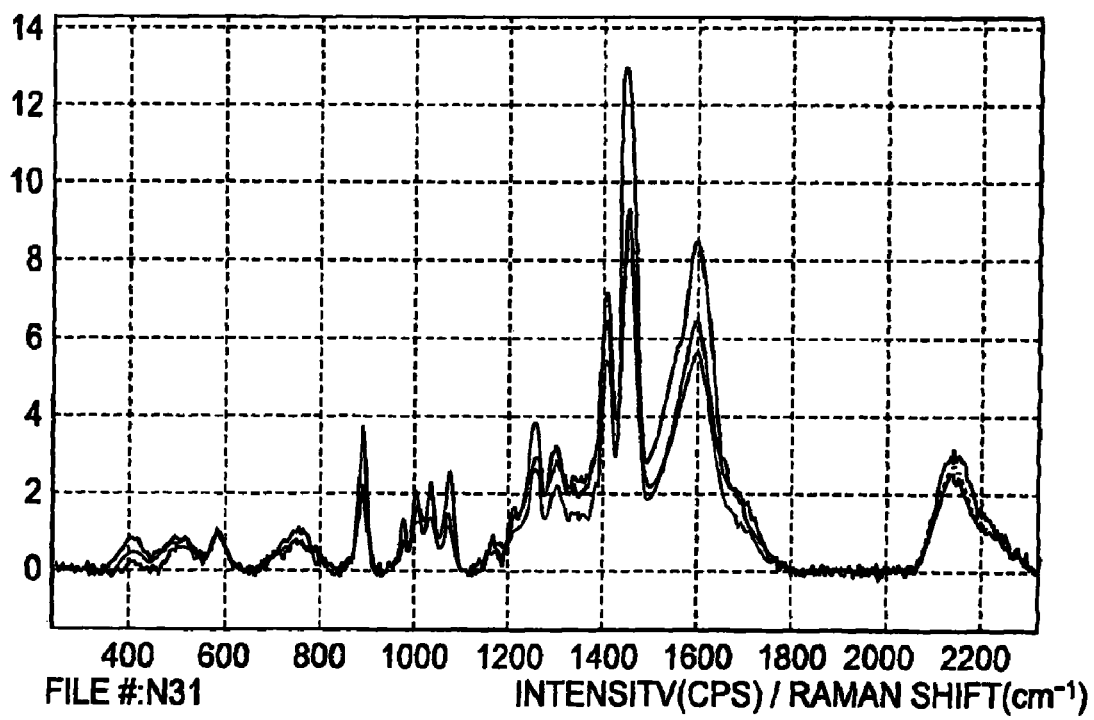
FIG. 2 is a graph showing spectra in Raman spectroscopic analysis of the samples having properties circled in FIG. 1.
Figure 3:
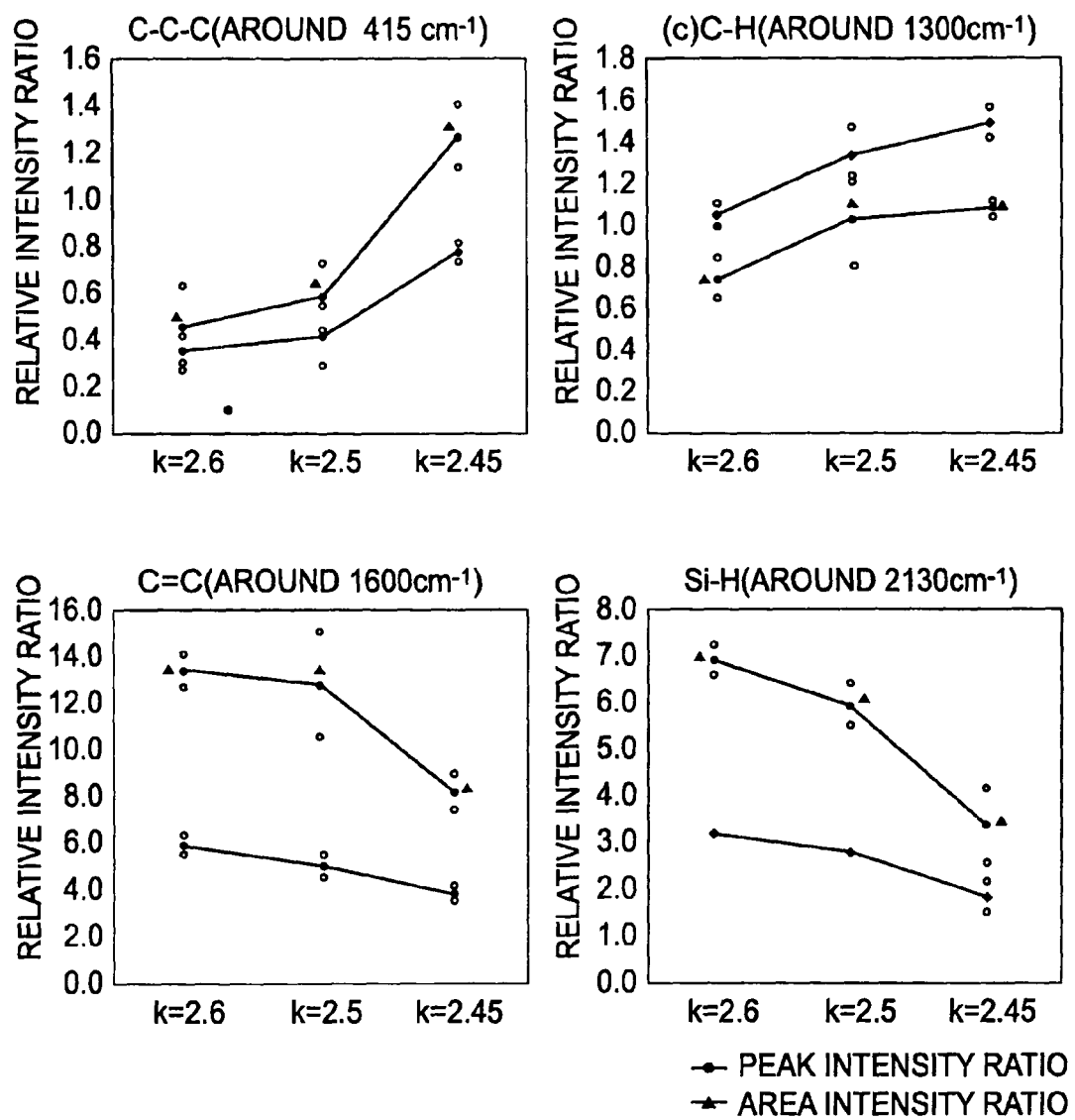
FIG. 3 is graphs showing relative comparison results of the bond strength in the samples having properties circled in FIG. 1.
Figure 4:
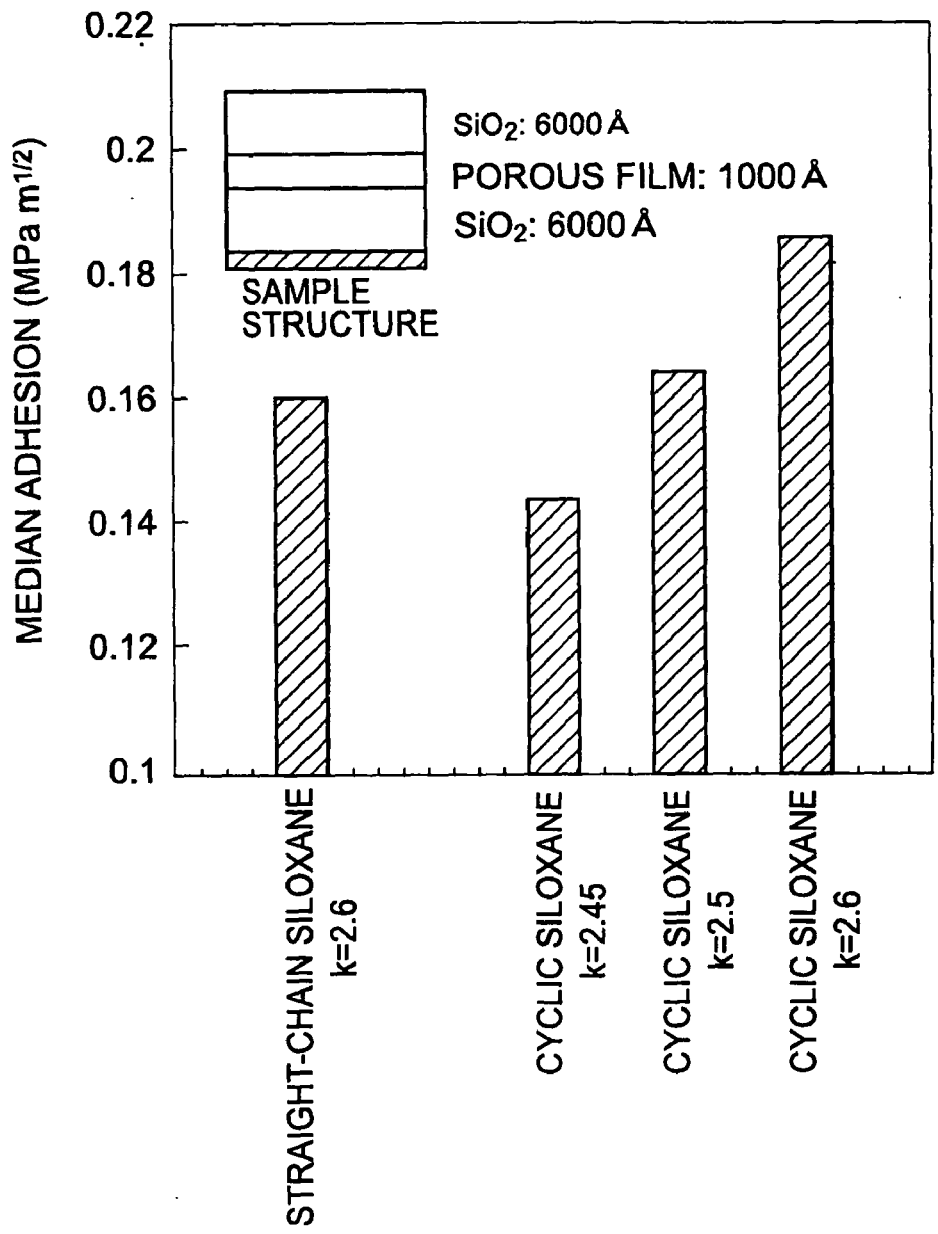
FIG. 4 is a graph showing results of evaluation employing the m-ELT test on adhesion of films in the samples having properties circled in FIG. 1 and a reference sample using another raw material.
Figure 5:
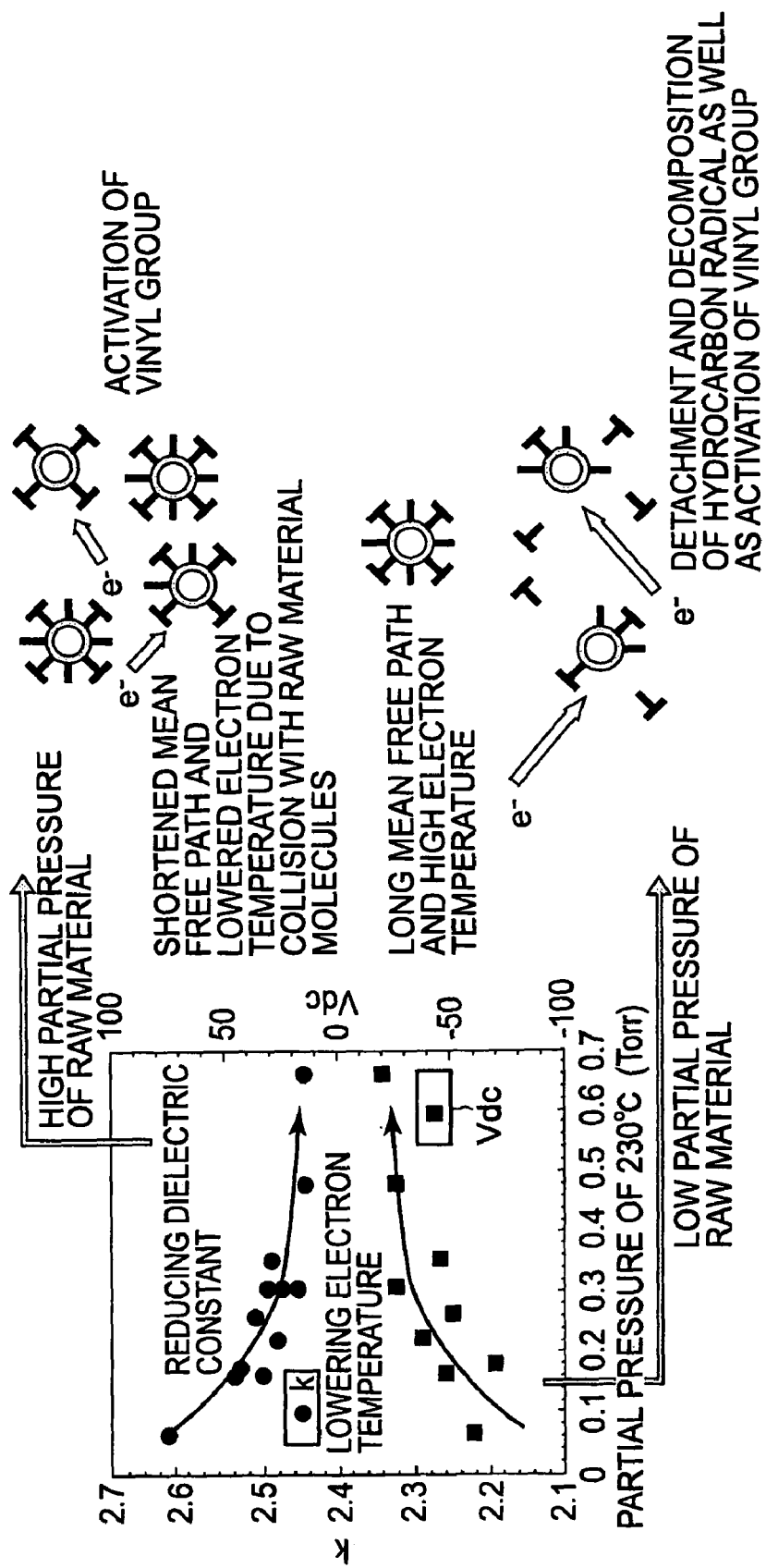
FIG. 5 is a diagram showing relationships between a partial pressure of the raw material and a self-bias of a showerhead (Vdc) and between a partial pressure of the raw material and a relative dielectric constant.

1 Member subject to deposition
10 Reaction chamber
20 Gas supply portion
50 Plasma CVD apparatus
100 Liquid raw material of cyclic organosiloxane
113 Silicon oxide film
200 MOSFET
201 Semiconductor substrate
202a, 202b Silicon oxide film
210a, 210b Metal interconnection material
211 Insulating barrier film
212 Via interlayer dielectric
213 Interconnection interlayer dielectric
214 Dual damascene trench
215 Barrier metal film

216, 216a Hard mask film
217b Etching stopper film
218a, 218b, 218c, 218d, 218e, 218f, 218g SiCN film
219a, 219b, 219c, 219d, 219e Porous insulating film
220a, 220b, 220c, 220d, 220e, 220f Cu—Al
221a, 221b, 221c, 221d, 221e, 221f Ta/TaN
222 TiN
223 Tungsten
224 Silicon oxynitride film
225a, 225b Ti/TiN
226 Al—Cu

BEST MODE FOR CARRYING OUT THE INVENTION

The meanings of the terms used for the present invention are described prior to detailed description of the present invention.

A low-dielectric-constant insulating film is an insulating film having a relative dielectric constant lower than that of a silicon oxide film (having a relative dielectric constant of 4.2). Low-dielectric-constant insulating films are employed, for example, as a film for isolating interconnection materials (interlayer dielectric) and used for the purpose of reducing the capacity between multilayer interconnections, which interconnects semiconductor devices. Low-dielectric-constant insulating films include what is called porous insulating films. Examples of porous insulating films include a silicon oxide film that is made porous to reduce the relative dielectric constant, HSQ (Hydrogen Silsesquioxane) film, SiOCH, SiOC (e.g., Black Diamond (trademark by Applied Materials, Inc.), CORAL (trademark by Novellus Systems, Inc.), and Aurora (trademark by ASM International)) that is made porous to reduce the relative dielectric constant, and the like. It has been desired to reduce the relative dielectric constant of those types of films.

A plasma vapor deposition method is a technique of supplying, for example, a gaseous material continuously to a reaction chamber under a reduced pressure, bringing molecules into an excited state by plasma energy, and forming a continuous film on a substrate through a vapor phase reaction, a substrate surface reaction, or the like.

Deposition refers to a process from the time when an insulating film begins to be formed on a substrate after the wafer has been supplied into a reaction chamber until the time when the formation of the insulating film is completed. The formation of the insulating film may not necessarily be performed continuously during that period of time. Any processes in which the insulating film is not formed may be included.

The m-ELT test is an abbreviated term for the modified Edge Lift-off Test, which is conducted in the following manner. First, an epoxy layer is applied to a sample. After a hardening process is performed at about 120° C., the sample is cooled. Peeling forces are applied to edge surfaces of each layer in the sample by residual stress in the epoxy layer which has been produced by the cooling. When peeled portions are detected by image processing, the temperature at that time is recorded. The value of the residual stress in the epoxy layer can be obtained from the temperature at the time of peeling. Accordingly, assuming that the energy released at the time of peeling is substantially equal to the elastic energy stored in the epoxy layer, the stress intensity (peel strength) applied to the thin test film is calculated. If the calculated value is large, then the adhesion can be determined to be high.

Damascene interconnections are embedded interconnections formed by embedding a metal interconnection material in grooves preformed in interlayer dielectrics and then removing excessive metal other than the metal in the grooves, for example, with a CMP (Chemical Mechanical Polishing) method or the like. In a case where damascene interconnections are formed of Cu, there is generally used an interconnection structure in which side surfaces and outer peripheries of the Cu interconnections are covered with a barrier metal whereas upper surfaces of the Cu interconnections are covered with an insulating barrier film.

The metal interconnection material refers to an interconnection material containing Cu as a principal component. In order to improve the reliability of the metal interconnection material, a metal element other than Cu may be included in a member made of Cu. A metal element other than Cu may be formed on an upper surface or a side surface of Cu.

The CMP method is a method of flowing a polishing liquid onto a wafer surface, bringing the wafer surface into contact with a polishing pad being rotated, and polishing the wafer surface to planarize irregularities of the wafer surface which have been produced during a multilayer interconnection formation process. In the interconnection formation with the damascene method, the CMP method is particularly used to remove excessive metal portions and obtain a flat interconnection surface after the metal has been embedded in interconnection grooves or via holes.

The barrier metal refers to a conductive film having barrier capability and covering side surfaces and lower surfaces of interconnections to prevent metal elements forming the interconnections from diffusing into interlayer dielectrics or underlying layers. For example, metals having a high melting point or nitrides thereof, such as tantalum (Ta), tantalum nitride (TaN), titanium nitride (TiN), and tungsten carbonitride (WCN), or a multilayered film of those metals are used if the interconnections are made of metal elements containing Cu as a principal component.

The insulating barrier film refers to an insulating film formed on upper surfaces of the Cu interconnections with a function of preventing oxidation of Cu and diffusion of Cu into insulating films and a function as an etching stopper layer during processing. The insulating barrier film is often called a capping film (Capping-dielectric: CAP) because it is formed on Cu interconnections. For example, an SiC film, an SiCN film, an SiN film, and the like are used as the insulating barrier film.

The semiconductor substrate refers to a substrate on which semiconductor devices are arranged. The semiconductor substrate includes not only monocrystalline silicon substrate, but also other types of substrates such as an SOI (Silicon on Insulator) substrate and a substrate for manufacturing a TFT (Thin film transistor) liquid crystal.

A hard mask refers to an insulating film stacked on an interlayer dielectric for protection when direct CMP is difficult to be conducted because of the lowered strength caused by reduction of the dielectric constant of the interlayer dielectric.

A passivation film refers to a film formed on the uppermost layer of a semiconductor device with a function of protecting the semiconductor device from external moisture and the like. According to the present invention, a silicon oxynitride film (SiON) formed by a plasma CVD method, a polyimide film, or the like is used as a passivation film.

A PVD (Physical Vapor Deposition) method is a deposition technique of colliding a cathode material called a target with ions generated in plasma and depositing emitted target atoms (sputtering phenomenon) on a wafer. Although a general sputtering method may be used, high directional sputtering methods, such as a long-throw sputtering method, a collimated sputtering method, and an ionized sputtering method, may also be used in view of improvement of the embedment characteristics, improvement of the film characteristics, and within-wafer uniformity of the film thickness. In a case of deposition of an alloy, an alloy film can be formed of a deposited metal film by including metal other than a principal component in a metal target within a solubility limit in advance. In the present invention, the PVD method can mainly be used to form a Cu seed layer or a barrier metal layer in formation of Cu damascene interconnections.

TDDB (Time Dependent Dielectric Breakdown) life is used as a technique of predicting, through an accelerated test, a period of time until dielectric breakdown. For example, when the TDDB life between interconnections is measured, a comb-like TEG (Test Element Group) is used. A relatively high electric field of about 1 MV/cm to about 4 MV/cm is applied between the interconnections under measurement conditions of a predetermined temperature (e.g., 125° C.). A leak current flowing between the interconnections is monitored. The superiority of the TDDB life can be compared by measuring periods of time from the beginning of the application of the electric field until dielectric breakdown.

Embodiment 1

According to the present invention, a porous insulating film suitable for an interlayer dielectric is formed. In a method of supplying at least a raw material of cyclic organosiloxane to a reaction chamber and forming an insulating film by a plasma vapor deposition method, a multilayered insulating film structure can be formed with a lowered relative dielectric constant and an improved adhesion by varying a partial pressure of the raw material of cyclic organosiloxane.

Hereinafter, Embodiment 1, in which a raw material of cyclic organosiloxane and an inert gas are supplied to a reaction chamber to form a porous insulating film, will be described with reference to FIG. 6.

Figure 6:
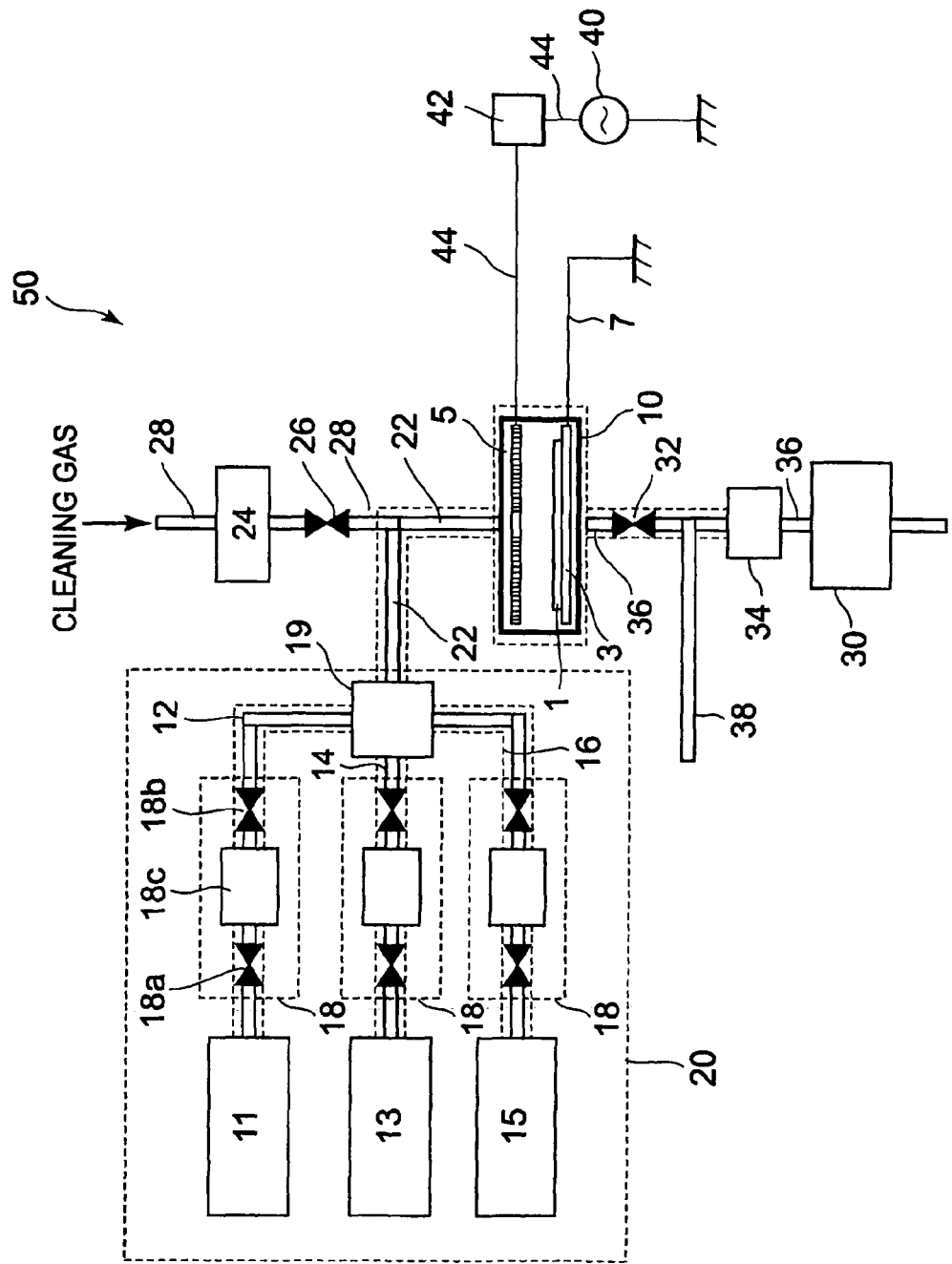
FIG. 6 is a schematic view showing an example of a plasma CVD apparatus that can be used to form (deposit) a porous insulating film according to a method of the present invention.

FIG. 6 is a schematic view showing an example of a plasma CVD apparatus that can be used to form (deposit) a porous insulating film according to a method of the present invention. The plasma CVD apparatus 50 shown in FIG. 6 has a reaction chamber 10, a gas supply portion 20, a vacuum pump 30, and a radiofrequency (RF) power source 40. The gas supply portion 20 is connected to the reaction chamber 10 through a gas supply pipe 22. The vacuum pump 30 is connected to the reaction chamber 10 through a gas discharge pipe 36, on which a valve 32 and a cold trap 34 are disposed between the vacuum pump 30 and the reaction chamber 10. The radiofrequency power source 40 is connected to the reaction chamber 10 via a high-frequency cable 44, on which a matching box 42 is disposed between the radiofrequency power source 40 and the reaction chamber 10.

A substrate heating portion 3 for holding and heating a member 1 subject to deposition, such as a semiconductor substrate, and a showerhead 5 connected to an end of the gas supply pipe 22 so as to function as an ejecting portion of a gas are arranged so as to face each other in the reaction chamber 10. An earth line 7 is connected to the substrate heating portion 3, and the high-frequency cable 44 is connected to the showerhead 5. A raw material gas or the like is supplied from the gas supply portion 20 through the gas supply pipe 22 to the showerhead 5. Simultaneously, a high-frequency power generated by the radiofrequency power source 40 is converted into a predetermined frequency by the matching box 42 disposed on the high-frequency cable 44 and then supplied to the showerhead 5. As a result, plasma can be generated from a gas in a space between the substrate heating portion 3 and the showerhead 5.

The gas supply portion 20 has a predetermined number of raw material gas supply tanks which corresponds to the number of types of raw material gases of cyclic organosiloxane to be used, a predetermined number of addition gas supply tanks which corresponds to the number of types of raw materials of compounds (addition gases) to be used, and gas supply tanks for a carrier gas or for an inert gas (hereinafter referred to as "gas supply tanks"). The gas supply portion 20 further has a mixer 19 for mixing gases supplied from the respective tanks.

One end of the gas supply pipe 22 is connected to the mixer 19. One cyclic organosiloxane raw material gas supply tank 11, one addition gas supply tank 13, and one inert gas supply tank 15 are illustrated in FIG. 6. The cyclic organosiloxane raw material gas supply tank 11 is connected to the mixer 19 through a pipe 12. The addition gas supply tank 13 is connected to the mixer 19 through a pipe 14. The inert gas supply tank 15 is connected to the mixer 19 through a pipe 16. A gas flow control portion 18 having two valves 18a, 18b and a gas flow controller 18c disposed between the valves 18a and 18b is provided on each of the pipes 12, 14, and 16.

A cleaning gas supply pipe 28, on which a flow controller 24 and a valve 26 are disposed, is connected to the gas supply pipe 22. A waste liquid pipe 38 is branched out from between the valve 32 and the cold trap 34 on the gas discharge pipe 36. It is desirable that heaters (not shown) for preventing the gases from being liquefied during the transfer process be provided around each of the pipes 12, 14, and 16 in the gas supply portion 20 or around the gas supply pipe 22 to heat those pipes 12, 14, and 16 or the gas supply pipe 22. Similarly, it is also desirable that a heater (not shown) be provided around the reaction chamber 10 to heat the reaction chamber 10.

To form a porous insulating film with the plasma CVD apparatus 50, a member 1 subject to deposition, such as a semiconductor substrate, is first placed on the substrate heating portion 3. Then, while the valve 32 is set in a variable state, the vacuum pump 30 is operated so that an initial degree of vacuum in the reaction chamber 10 is lowered to several Torr. Moisture in the gas discharged from the reaction chamber 10 is removed by the cold trap 34. Next, the raw material gas (gaseous cyclic organosiloxane), the addition gas, and the inert gas (carrier gas) are supplied from the gas supply portion 20 to the reaction chamber 10, and the radiofrequency power source 40 and the matching box 42 are operated to supply a radiofrequency power having a predetermined frequency to the reaction chamber 10.

At that time, each gas is controlled in flow rate by the corresponding flow control portion 18, mixed into a mixed gas having predetermined composition by the mixer 19, and supplied to the reaction chamber 10. It is desirable that the partial pressure of the raw material gas in the reaction chamber 10 be properly selected within a range of about 0.1 Torr to about 3 Torr. It is desirable that the ambient pressure of the reaction chamber 10 during deposition be set in a range of about 1 Torr to about 6 Torr by controlling the operation of the vacuum pump 30. At that time, in order to obtain an insulating film having a low relative dielectric constant, it is desirable that at least the partial pressure of the raw material be not more than 0.3 Torr.

It is preferable that the carrier gas and the inert gas are one of He, Ne, Ar, Kr, Xe, and Rn. Alternatively, the carrier gas and the inert gas may employ a mixed gas thereof. Hereinafter, the carrier gas and the inert gas supplied to the reaction chamber are collectively referred to as the inert gas. For example, He may be supplied as a carrier gas to the reaction chamber through a vaporizer, and Ar may be supplied as an inert gas to the reaction chamber through a pipe of a separate system.

During deposition, a surface temperature of the member 1 subject to deposition can properly be set within a range of 100° C. to 400° C. by heating the member 1 subject to deposition with the substrate heating portion 3 and is preferably set within a range of 200° C. to 350° C.

When deposition is performed under these conditions, molecules of the raw material of cyclic organosiloxane in the raw material gas are excited by the plasma and reach, in an activated state, the surface of the member 1 subject to deposition, where the molecules form a porous insulating film. If the porous insulating film has a group including an unsaturated bond, then molecules of an organic silicon compound that has been excited and activated by plasma reach the surface of the member 1 subject to deposition and further receive thermal energy from the substrate heating portion 3. Accordingly, the ring of the aforementioned group having the unsaturated bond is opened, and thermal polymerization reaction proceeds between the molecules. Thus, the porous insulating film grows.

Here, there will be described in detail a deposition process in which a partial pressure of the raw material is changed by varying a volume ratio of the cyclic organosiloxane and the inert gas during plasma excitation according to the present invention.

Figure 7:
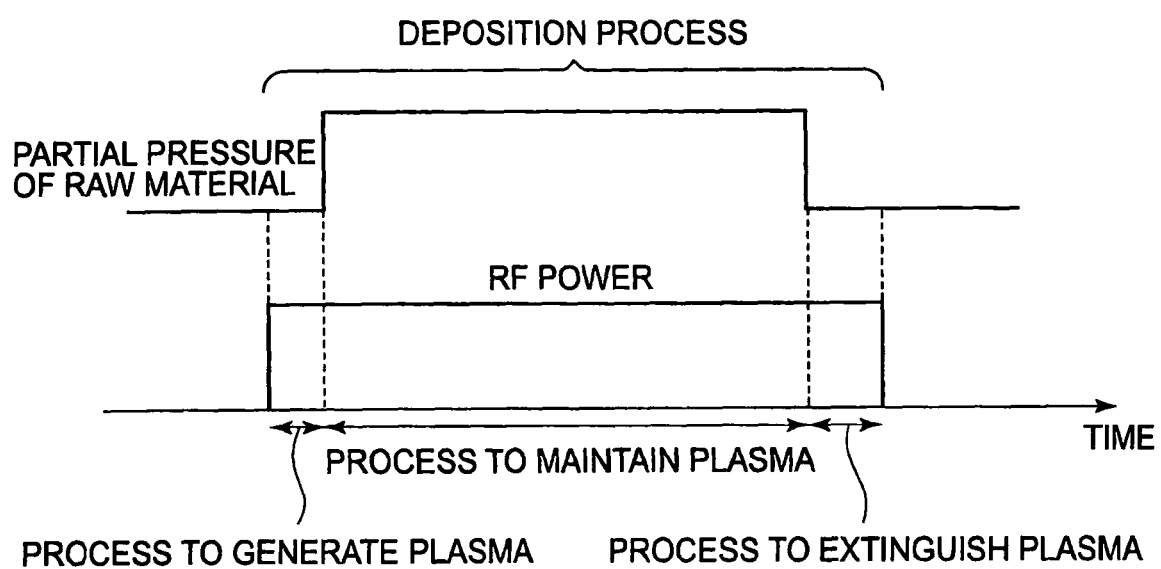
FIG. 7 is a time chart showing time variations of a partial pressure of a raw material and a radiofrequency (RF) power in a deposition process of Embodiment 1.

FIG. 7 shows time variations of the partial pressure of the raw material and the radiofrequency (RF) power in the deposition process. When the pressure in the reaction chamber is stabilized at a desired value, an RF power is applied so as to excite plasma. (This process is referred to as a "process to excite plasma" or a "process to generate plasma.")

Subsequently, the partial pressure of the raw material is changed to a high partial pressure of the raw material to maintain the plasma depending on a desired film thickness of an insulating film. (This process is referred to as a "process to maintain the plasma.") After that, the partial pressure of the raw material is changed to a low partial pressure of the raw material, and then the application of the RF power is stopped. (This process is referred to as a "process to extinguish the plasma.")

Figure 8:
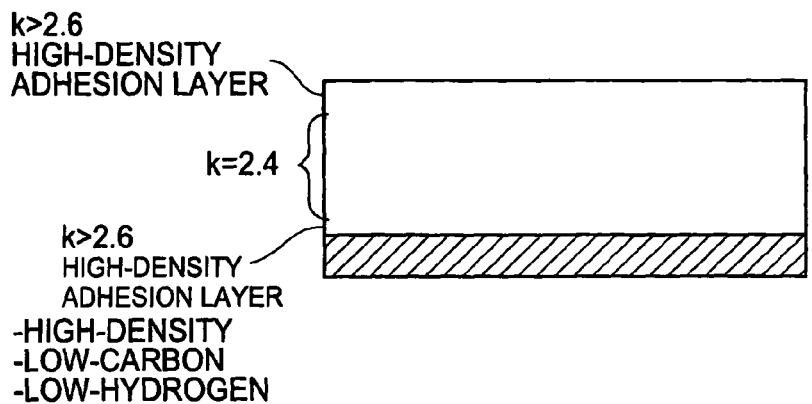
FIG. 8 is a diagram schematically showing a multilayered structure of the porous insulating film.

By using such a deposition process in which the partial pressure of the raw material is changed, it is possible to obtain a porous insulating film having a multilayered structure, as shown in FIG. 8, with a continuous variation.

Figure 9:
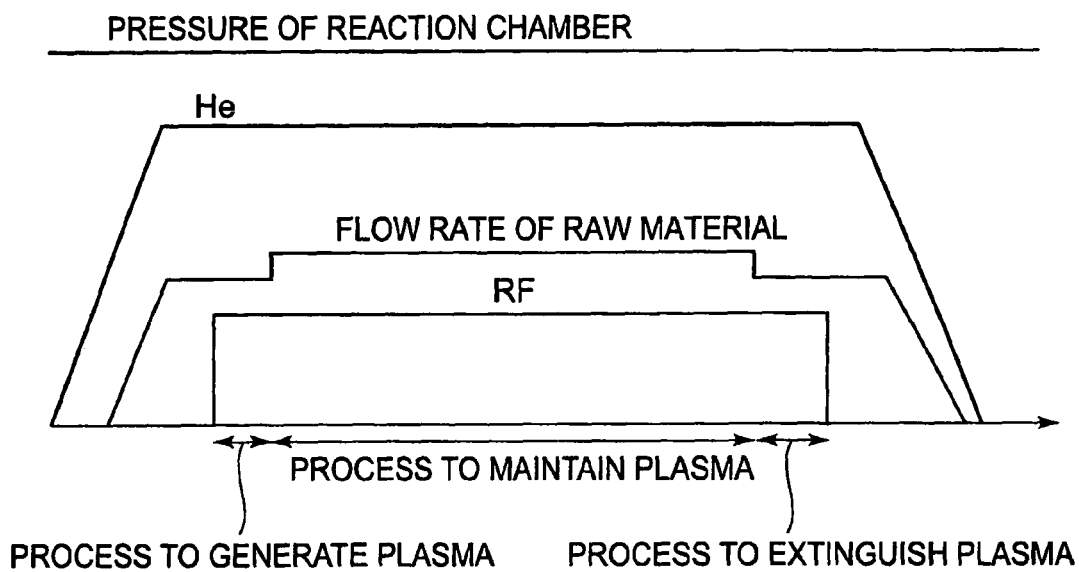
FIG. 9 is a time chart showing time variations of a flow rate of a raw material to be supplied to a reaction chamber, a flow rate of an inert gas, an RF power, and a pressure of the reaction chamber during a deposition process (increasing the flow rate of the raw material).
Figure 10:
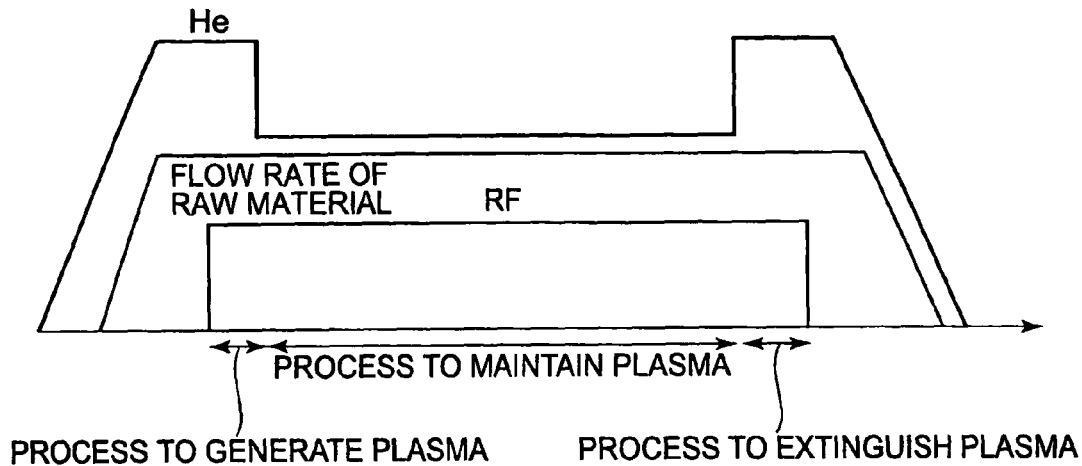
FIG. 10 is a time chart showing time variations of a flow rate of a raw material to be supplied to a reaction chamber, a flow rate of an inert gas, an RF power, and a pressure of the reaction chamber during a deposition process (decreasing the flow rate of the inert gas).
Figure 11:
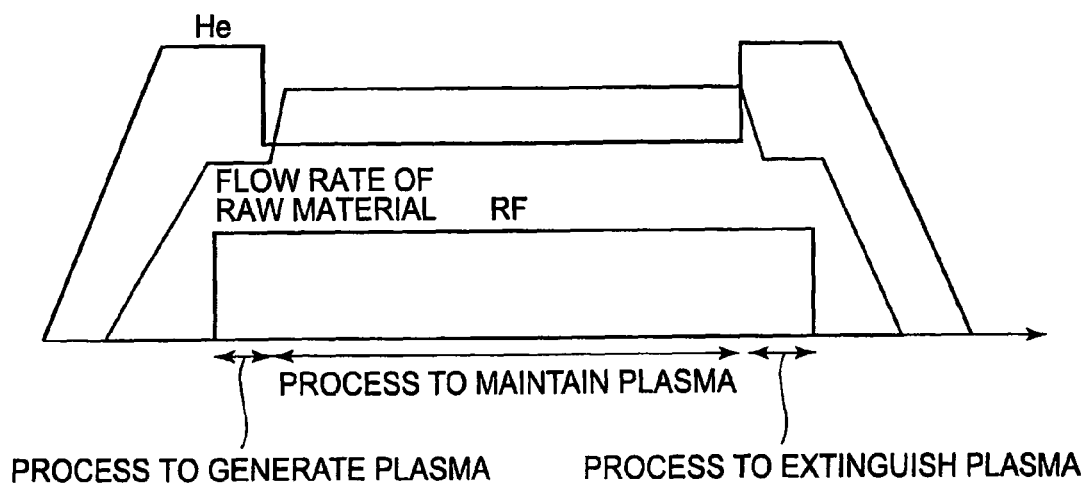
FIG. 11 is a time chart showing time variations of a flow rate of a raw material to be supplied to a reaction chamber, a flow rate of an inert gas, an RF power, and a pressure of the reaction chamber during a deposition process (increasing the flow rate of the raw material and decreasing the flow rate of the inert gas).
Figure 12:
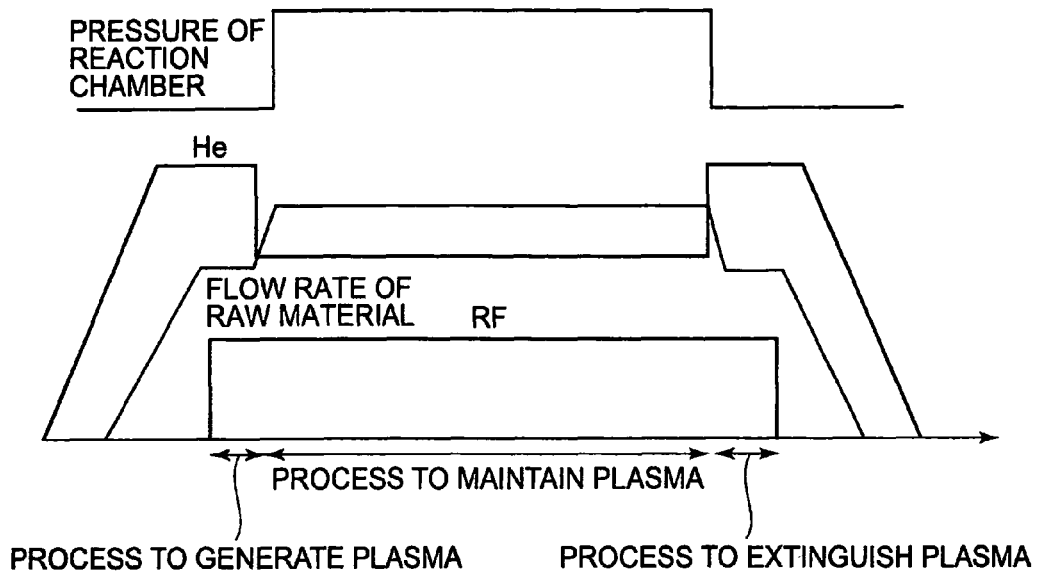
FIG. 12 is a time chart showing time variations of a flow rate of a raw material to be supplied to a reaction chamber, a flow rate of an inert gas, an RF power, and a pressure of the reaction chamber during a deposition process (increasing the flow rate of the raw material, decreasing the flow rate of the inert gas, and increasing the pressure of the reaction chamber).

Here, in order to increase the partial pressure of the raw material, a method of increasing a flow rate of the raw material to be supplied to the reaction chamber (FIG. 9), a method of decreasing a flow rate of the inert gas to be supplied to the reaction chamber (FIG. 10), and the like may be used, or a combination of these methods (FIG. 11) may be used. Furthermore, a pressure of the reaction chamber may simultaneously be varied within a range in which the uniformity of the film thickness is maintained within the wafer (FIG. 12).

Gases such as nitrogen trifluoride ($NF_3$), sulfur hexafluoride ($SF_6$), tetrafluoromethane ($CF_4$), and hexafluoroethane ($C_2F_6$) may be used for cleaning of the reaction chamber 10. A mixed gas in which such gases are mixed with oxygen gas, ozone gas, and the like may be used as needed. The cleaning gas is supplied to the reaction chamber 10 through the cleaning gas supply pipe 28. As in the deposition, a radiofrequency power is applied between the showerhead 5 and the substrate heating portion 3 to induce plasma and conduct cleaning of the reaction chamber 10. It is also effective to use a cleaning gas that has been preformed into a plasma state by using remote plasma or the like.

Embodiment 2

There will be described Embodiment 2 according to the present invention in which a porous insulating film suitable for an interlayer dielectric is formed by introducing an addition gas into a reaction chamber in addition to a raw material of cyclic organosiloxane and an inert carrier gas in a method of supplying at least a raw material of cyclic organosiloxane to a reaction chamber and forming an insulating film by a plasma vapor deposition method.

Figure 13:
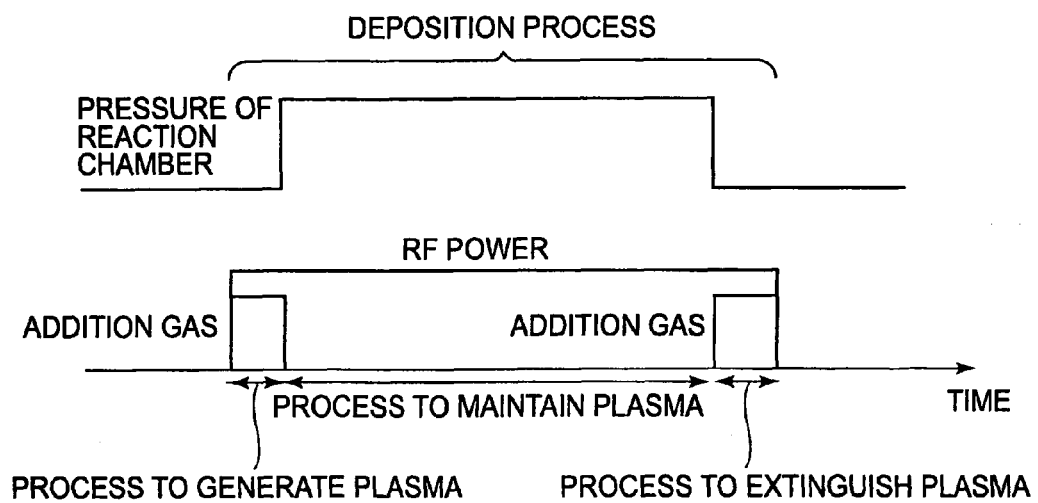
FIG. 13 is a time chart showing time variations of a partial pressure of a raw material and an RF power in a deposition process of Embodiment 2.

FIG. 13 shows time dependency of a partial pressure of the raw material and an RF power in the deposition process. When the pressure of the reaction chamber is stabilized at a desired value, an RF power is applied for excitation. Specifically, plasma is continuously excited for about 1 second to about 30 seconds. (This process is referred to as a "process to excite plasma" or a "process to generate plasma.") At that time, a ratio of the raw material gas is changed by introduction of an addition gas, so that a layer having excellent adhesion can be formed. Preferable examples of the addition gas include at least one of $O_2$, $CO_2$, methanol, ethanol, propanol, and isopropanol. When such a gas is introduced, for example, not only the partial pressure of the raw material is changed due to the addition, but oxidation of hydrocarbon components by reaction of oxygen is promoted. Therefore, it is possible to obtain a film having fewer hydrocarbon components.

Subsequently, the partial pressure of the raw material is changed to a high partial pressure of the raw material to maintain the plasma depending on a desired film thickness of an insulating film. (This process is referred to as a "process to maintain the plasma.") At that time, by stopping the supply of the addition gas, it is possible to form an insulating film layer having a low relative dielectric constant.

Then the partial pressure of the raw material is changed to a low partial pressure of the raw material, and, after a while, the application of the RF power is stopped. (This process is referred to as a "process to extinguish the plasma.") In this process, by restarting the supply of the addition gas, it is possible to form a layer having fewer hydrocarbon components with excellent adhesion.

By using such a process to mix an addition gas and a deposition process in which a partial pressure of the raw material is changed, it is possible to obtain a porous insulating film having a structure as shown in FIG. 8.

Embodiment 3

According to the present invention, a porous insulating film suitable for an interlayer dielectric is formed. In a method of supplying at least a raw material of cyclic organosiloxane to a reaction chamber and forming an insulating film by a plasma vapor deposition method, a multilayered insulating film structure can be formed with having excellent adhesion and maintaining a low relative dielectric constant by controlling a partial pressure of the raw material of the cyclic organosiloxane.

There will be described below Embodiment 3 in which a porous insulating film is formed by changing an impressed power applied during plasma excitation in addition to changing a partial pressure of the raw material.

Figure 14:
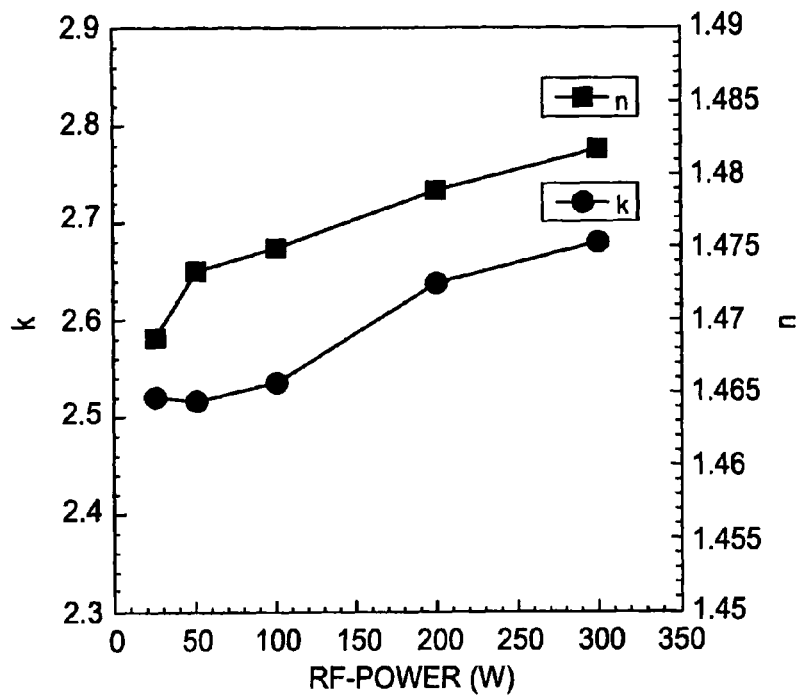
FIG. 14 is a graph showing RF power dependency of a relative dielectric constant k and a refractive index n of films formed by using a raw material having a structure expressed by the chemical structure formula (4) as cyclic organosiloxane and He as an inert carrier gas.

FIG. 14 shows RF power dependency in a case where a raw material having a structure expressed by the chemical structure formula (4) was used as cyclic organosiloxane and He was used as an inert carrier gas. The substrate temperature was 350° C., the flow rate of He was 1000 sccm, and the flow rate of the raw material was 65 sccm. It can be understood that the relative dielectric constant k and the refractive index n became higher as the RF power was increased. By using this phenomenon with changing the RF power according to the change of the partial pressure of the raw material, it is possible to achieve more accurate control of the resultant porous film.

Figure 15:
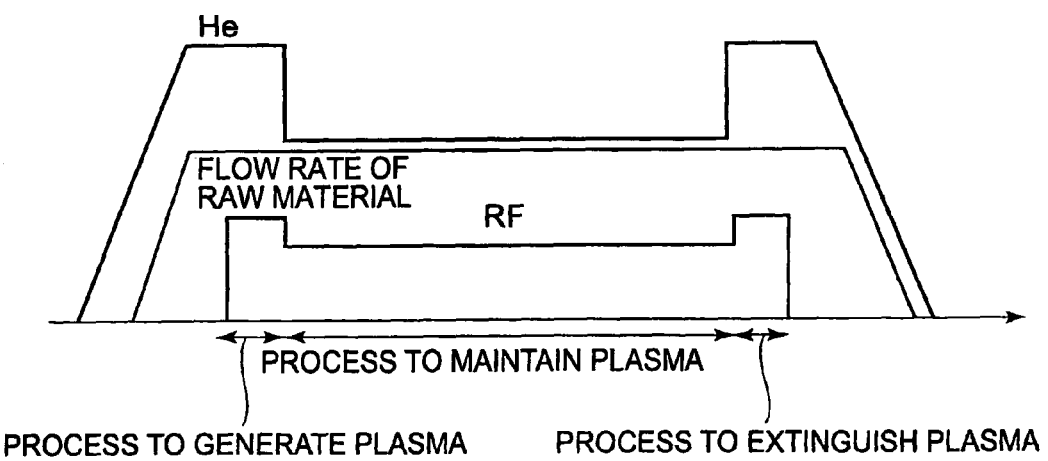
FIG. 15 is a time chart showing time variations of a flow rate of a raw material to be supplied to a reaction chamber in a deposition process of Embodiment 3, a flow rate of an inert gas, an RF power, and a pressure of the reaction chamber.

FIG. 15 shows changes of the partial pressure of the raw material and the RF power in the deposition process. When the pressure in the reaction chamber is stabilized at a desired value, an RF power is applied so as to excite plasma. (This process is referred to as a "process to excite plasma" or a "process to generate plasma.")

Subsequently, the partial pressure of the raw material is changed to a high partial pressure of the raw material to maintain the plasma depending on a desired film thickness of an insulating film. (This process is referred to as a "process to maintain the plasma.") It is desirable that an RF power applied to the showerhead at that time be lower than that in the process to excite the plasma. With a lowered RF power, breakage of the raw material structure can be prevented more effectively, so that the relative dielectric constant can be maintained at a low value.

After that, the partial pressure of the raw material is changed to a low partial pressure of the raw material, and then the application of the RF power is stopped. (This process is referred to as a "process to extinguish the plasma.") It is desirable that an RF power applied in this process be higher than the RF power in the process to maintain the plasma. With an increased RF power, it is possible to form a layer having fewer hydrocarbon components with excellent adhesion.

Thus, by changing the RF power according to the change of the partial pressure of the raw material, it is possible to obtain a porous insulating film having a structure as shown in FIG. 8.

Embodiment 4

There will be described below Embodiment 4 in which a porous insulating film having a multilayered structure is formed by applying a low-frequency power to a substrate in addition to changing a partial pressure of the raw material.

Figure 16:
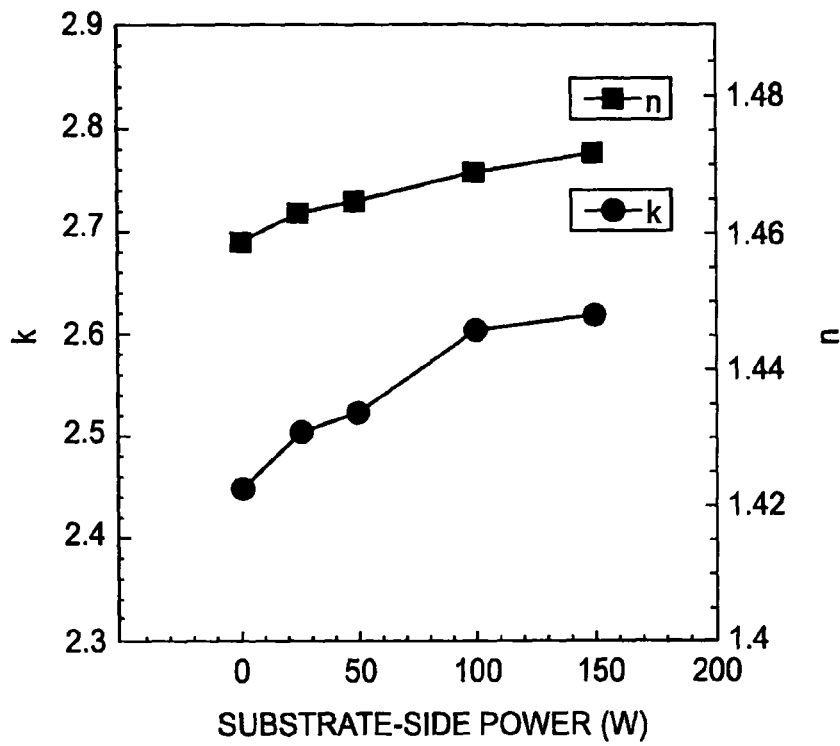
FIG. 16 is a graph showing substrate-side power dependency of a relative dielectric constant k and a refractive index n of films formed by using a raw material having a structure expressed by the chemical structure formula (4) as cyclic organosiloxane and He as an inert carrier gas.

FIG. 16 shows substrate-side power dependency in a case where a raw material having a structure expressed by the chemical structure formula (4) was used as cyclic organosiloxane and He was used as an inert carrier gas. The substrate temperature was 350° C., the flow rate of He was 500 sccm, and the flow rate of the raw material was 65 sccm. The RF power applied to the showerhead was 90 W at 13.5 MHz, and the low-frequency power had a frequency of 420 kHz. It can be understood that the relative dielectric constant k and the refractive index n became higher as the substrate-side low-frequency power was increased. This is probably because hydrocarbon components were detached by bombardment of ions in the plasma on the substrate due to the low-frequency power. By using this phenomenon with changing the substrate-side low-frequency power according to the change of the partial pressure of the raw material, it is possible to achieve more accurate control of the resultant porous film.

Figure 17:
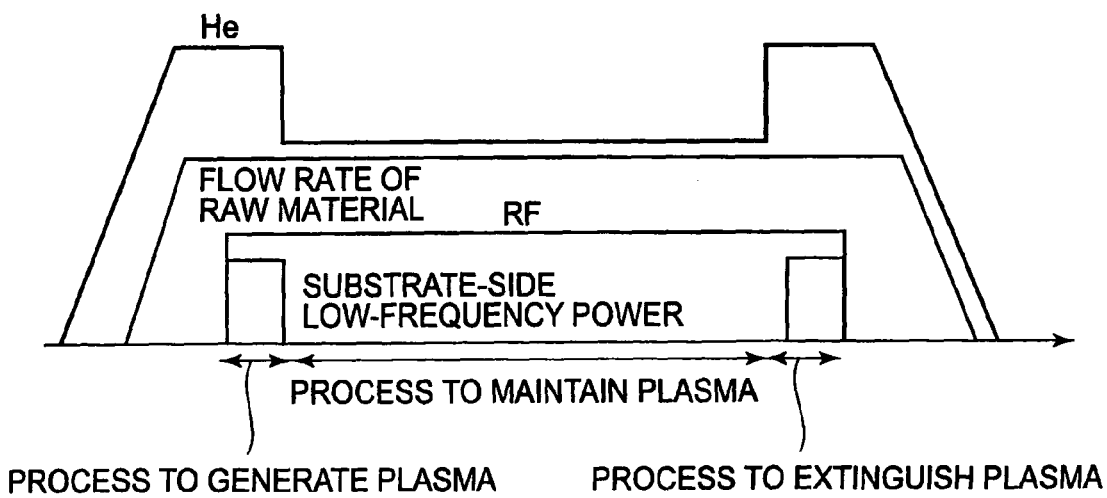
FIG. 17 is a time chart showing time variations of a flow rate of a raw material to be supplied to a reaction chamber in a deposition process of Embodiment 4, a flow rate of an inert gas, an RF power, and a pressure of the reaction chamber.

FIG. 17 shows changes of the partial pressure of the raw material and the RF power in the deposition process. When a pressure in the reaction chamber is stabilized at a desired value, an RF power is applied so as to excite plasma. Specifically, plasma is continuously excited for about 1 second to about 30 seconds. (This process is referred to as a "process to excite plasma" or a "process to generate plasma.") At that time, by simultaneously applying a low-frequency power to the substrate, it is possible to form a layer having excellent adhesion.

Subsequently, the partial pressure of the raw material is changed to a high partial pressure of the raw material to maintain the plasma depending on a desired film thickness of an insulating film. (This process is referred to as a "process to maintain the plasma.") At that time, the application of the low-frequency power to the substrate is stopped. This prevents breakage of the raw material structure more effectively, so that the relative dielectric constant can be maintained at a low value.

After that, the partial pressure of the raw material is changed to a low partial pressure of the raw material, and then the application of the RF power is stopped. (This process is referred to as a "process to extinguish the plasma.") In this process, a low-frequency power is reapplied to the substrate, so that it is possible to form a layer having fewer hydrocarbon components with excellent adhesion.

Thus, by using such a deposition process in which the low-frequency power applied to the substrate is changed while the partial pressure of the raw material is changed, it is possible to obtain a porous insulating film having a structure as shown in FIG. 8.

Embodiment 5

There will be described another Embodiment 5 in which an addition gas is introduced into a reaction chamber in addition to a raw material of cyclic organosiloxane and an inert carrier gas.

Figure 18:
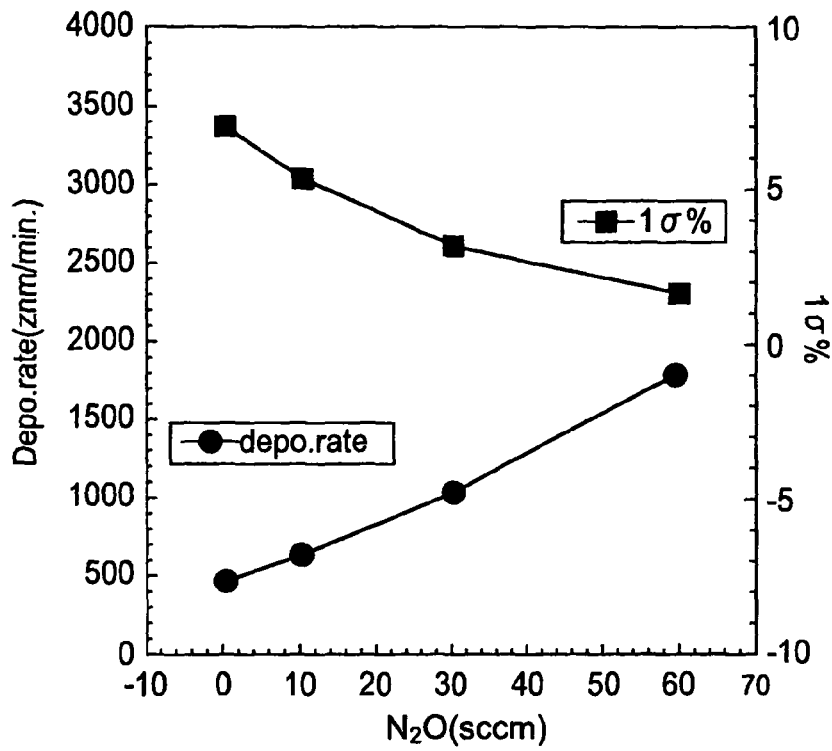
FIG. 18 is a graph showing $N_2O$-addition-flow-rate dependency of a deposition rate and within-wafer distribution of films formed by using a raw material having a structure expressed by the chemical structure formula (4) as cyclic organosiloxane and He as an inert carrier gas.

FIG. 18 shows $N_2O$-addition-flow-rate dependency in a case where a raw material having a structure expressed by the chemical structure formula (4) was used as cyclic organosiloxane and He was used as an inert carrier gas. The substrate temperature was 350° C., the flow rate of He was 500 sccm, and the flow rate of the raw material was 65 sccm. The RF power applied to the showerhead was 90 W at 13.5 MHz. It can be understood that the deposition rate and the within-wafer film thickness distribution ($1\sigma$ %) were improved as $N_2O$ was added more. This is possibly because the number of electrons generated was increased by adding $N_2O$ into the plasma. At that time, it was confirmed that the deposition rate was improved while the relative dielectric constant of the film did not change. By using this phenomenon with adding $N_2O$ according to the change of the partial pressure of the raw material, it is possible to achieve more accurate control of the resultant porous film.

Figure 19:
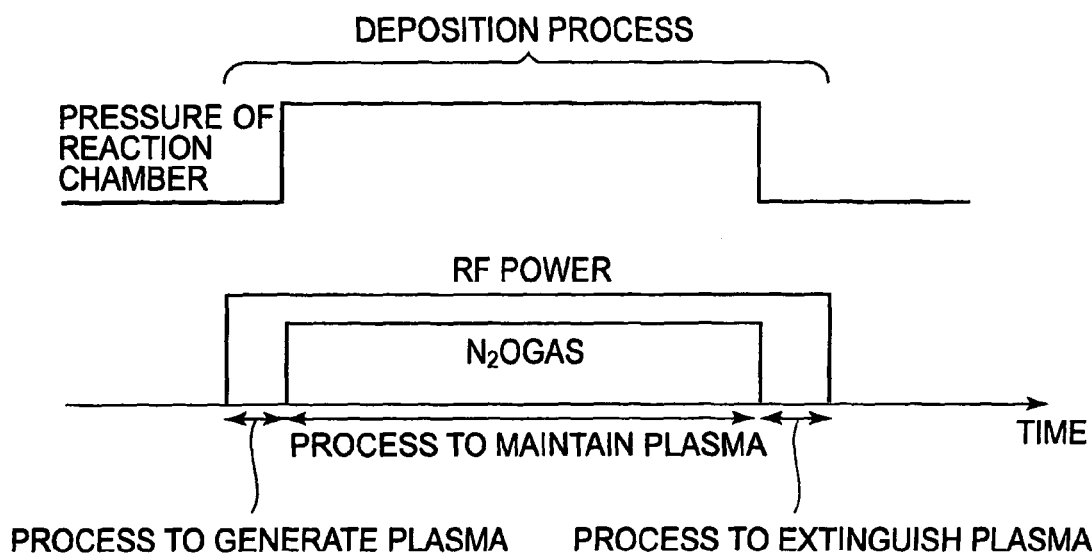
FIG. 19 is a time chart showing time variations of a partial pressure of the raw material, a flow rate of an $N_2O$ gas, and an RF power in a deposition process of Embodiment 5.

FIG. 19 shows changes of the partial pressure of the raw material and the $N_2O$ flow rate in the deposition process. When the pressure in the reaction chamber is stabilized at a desired value, an RF power is applied so as to excite plasma. (This process is referred to as a "process to excite plasma" or a "process to generate plasma.") At that time, the partial pressure of the raw material is maintained at a low value, so that a layer having excellent adhesion can be formed.

Subsequently, the partial pressure of the raw material is changed to a high partial pressure of the raw material to maintain the plasma depending on a desired film thickness of an insulating film. (This process is referred to as a "process to maintain the plasma.") At that time, the deposition rate can be improved by simultaneously starting addition of $N_2O$. After that, the partial pressure of the raw material is changed to a low partial pressure of the raw material, and then the application of the RF power is stopped. (This process is referred to as a "process to extinguish the plasma.") Here, the deposition rate is reduced by stopping the addition of $N_2O$ concurrently with the change of the partial pressure of the raw material. Thus, it is possible to control the thickness of a layer having fewer hydrocarbon components and excellent adhesion with high accuracy.

Figure 20:
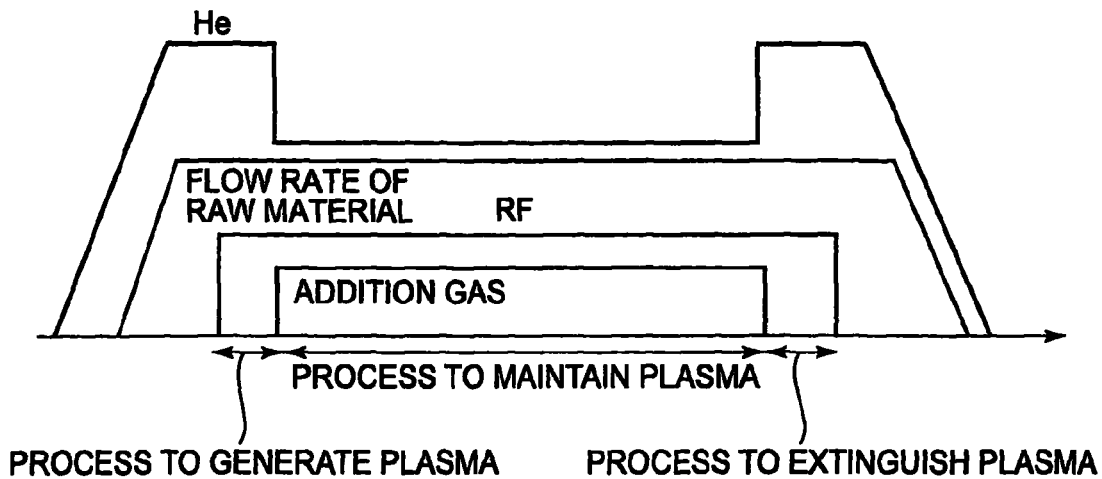
FIG. 20 is a time chart showing time variations of a flow rate of a raw material to be supplied to a reaction chamber in the deposition process of Embodiment 5, a flow rate of an inert gas, an RF power, a flow rate of an addition gas, and a pressure of the reaction chamber.

In the process to maintain the plasma, if $N_2O$ is simply added, then the partial pressure of the raw material is lowered. However, as in a deposition process shown in FIG. 20, the addition of $N_2O$ can be performed without lowering the partial pressure of the raw-material by controlling the flow rate of the inert carrier gas and the total pressure of the reaction chamber.

Thus, by controlling the addition of $N_2O$ concurrently with the change of the partial pressure of the raw material, the thickness of the adhesion layer can be controlled with high accuracy while the deposition rate is improved. In this manner, it is possible to obtain a porous insulating film having a structure as shown in FIG. 8.

Instead of $N_2O$ as an addition gas for improving the deposition rate without increasing the relative dielectric constant, $SiH_4$ or the like can be employed. One of ethylene, acetylene, benzene, and trimethylbenzene, each of which includes unsaturated hydrocarbon groups, can be used as other types of addition gas. Because those compounds undergo addition reaction by protons in the plasma, the growth rate can be improved.

Embodiment 6

There will described in detail an interconnection structure in which a porous insulating film having a multilayered structure according to the present invention is used for a multilayer interconnection on a semiconductor substrate on which a semiconductor device is formed.

Figure 21A:
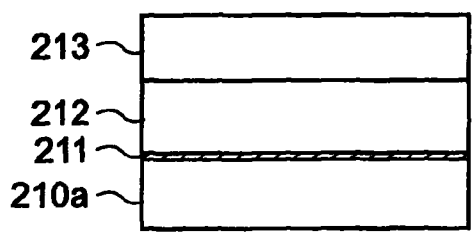
FIGS. 21(a), 21(b), 21(c), and 21(d) are diagrams showing a manufacturing process of a multilayer interconnection in a semiconductor device which employs a formation method of a porous insulating film according to the present invention.

As shown in FIG. 21(a), a metal interconnection material 210a and an insulating barrier film 211 are stacked on a semiconductor substrate (not shown) on which a semiconductor device is formed. A via interlayer dielectric 212 and an interconnection interlayer dielectric 213 are formed thereon.

The metal interconnection material 210a contains Cu as a principal component. In order to improve the reliability of the metal interconnection material 210a, a metal element other than Cu may be included in a member made of Cu or may be formed on an upper surface or side surfaces of Cu.

The insulating barrier film 211 is made of an SiN, SiCN, or SiC film, or the like. The film thickness of the insulating barrier film 211 is in a range of 200 Å to 500 Å, and the insulating barrier film 211 is formed by a plasma CVD method.

It is desirable that the via interlayer dielectric 212 have a film thickness of about 1000 Å to about 3000 Å and a relative dielectric constant not more than 3.0. For example, a porous insulating film, formed according to the present invention, including at least silicon, oxygen, carbon, and hydrogen may be used for the via interlayer dielectric 212. Typical examples include HSQ (Hydrogen Silsesquioxane) film (e.g., Type 12 (trademark)), MSQ (Methyl Silsesquioxane) film (e.g., JSR-LKD (trademark by JSR Corp.), ALCAP (trademark by Asahi Kasei Corp.), NCS (trademark by Fujitsu Ltd.), IPS (trademark by Catalysts & Chemicals Industries Co., Ltd.), HOSP (trademark by Honeywell), organic polymer film (e.g., SiLK (by Dow Chemical Co.), Flare (trademark by Honeywell Electronic Materials), or SiOCH, SiOC (e.g., Black Diamond (trademark by Applied Material Inc.), CORAL (trademark by Novellus Systems Inc.), Aurora ULK (trademark by ASM International), Orion (trademark by Trikon Technologies Inc. and the like), or an insulating thin film made by increasing an organic content of those materials, or a film having a plurality of layers by stacking some of those materials, or a film made by varying the composition or density of a film of one of those materials in the film thickness direction.

The interconnection interlayer dielectric 213 is a porous insulating film, formed according to the present invention, including at least silicon, oxygen, carbon, and hydrogen. The film thickness of the interconnection interlayer dielectric 213 is preferably in a range of about 500 Å to about 2000 Å. This film is a porous insulating film having a multilayered structure with excellent adhesion, formed by varying a partial pressure of a raw material during plasma excitation, as described in Embodiments 1 to 5.

Figure 21C:
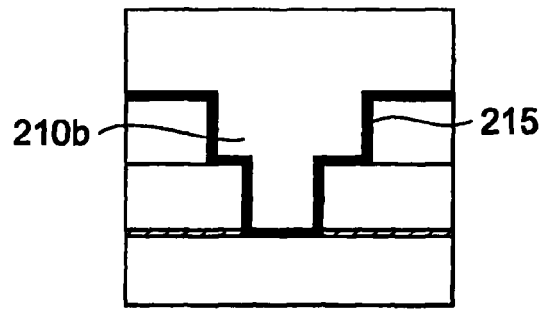
Figure 21B:
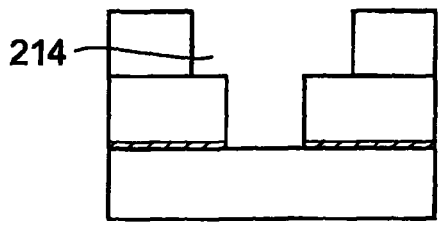

Subsequently, as shown in FIG. 21(b), a dual damascene trench 214 is formed by patterning and dry etching with use of photoresists.

The dry etching method used for the porous insulating film at that time will be described in detail. For example, a mixture of tetrafluorocarbon ($CF_4$) mixed with argon (Ar) and nitrogen ($N_2$) at any proportions can be used as an etching gas, and a parallel-plate dry etching apparatus may be employed to conduct etching. Then a photoresist remaining after the etching is removed by $O_2$ ashing. At that time, because the porous insulating film is vulnerable to oxygen plasma, direct exposure to the $O_2$ ashing is undesirable. Therefore, it is preferable to use a method in which the porous insulating film is not exposed to the $O_2$ ashing (hard mask processing) or to use $N_2/H_2$ ashing or $He/H_2$ ashing. Under certain circumstances, the substrate may be heated to about 150° C. to about 250° C. in order to improve a rate of ashing.

Figure 21D:
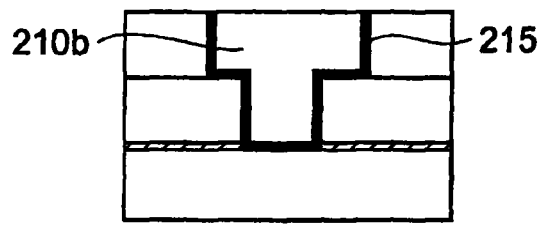

Next, as shown in FIG. 21(c), a metal interconnection material 210b and a barrier metal 215 are embedded in the dual damascene trench. As shown in FIG. 21(d), excessive wiring is removed by a CMP method, so that a dual damascene interconnection is formed.

Here, the barrier metal film 215 can be formed by a sputtering method, a CVD method, an ALCVD (Atomic Layer Chemical Vapor Deposition) method, or the like. For example, metals having a high melting point or nitrides thereof, such as tantalum (Ta), tantalum nitride (TaN), titanium nitride (TiN), and tungsten carbonitride (WCN), or multilayered films thereof are used. In particular, it is preferable to use a multilayered film of Ta/TaN (=an upper layer/a lower layer).

The metal interconnection material 210b can be formed by a sputtering method using a Cu target, a CVD method, or an electrolytic plating method using an electrode of a Cu film formed by such a method. It is also effective to select at least one metal element among from aluminum, tin, titanium, tungsten, silver, zirconium, indium, and magnesium and to add it as a metal element other than the principal component. Furthermore, it is also effective to use a metal other than Cu, such as tungsten (W), or a compound such as CoWP as an adhesion layer or insert it between the Cu interconnection and the insulating barrier film.

The multilayer interconnection thus formed has a low relative dielectric constant between interconnections because of introduction of the porous insulating film. Furthermore, because of having the multilayered insulating film structure, the multilayer interconnection has excellent strength to packaging and the reliability after formation of the multilayer interconnection.

FIGS. 22(a) to 22(c) show examples of the structure of the dual damascene interconnection thus formed.

As shown in FIG. 22(a), a lower-layer metal interconnection material includes a Ta/TaN barrier metal 215a and a Cu—Al interconnection 210a. The Cu—Al interconnection 210a includes Cu as a principal component and contains Al at not more than 1.2 atm %. An upper surface of the lower-layer metal interconnection is covered with an insulating barrier film 211a. In this example, an SiCN film, formed by a plasma CVD method, having a relative dielectric constant of 4.9 is used as the insulating barrier film 211a.

A via interlayer dielectric 212b formed on the lower-layer metal interconnection can employ an SiOCH film formed by a plasma CVD method, such as Aurora-ULK (trademark) or Black Diamond (trademark). An interconnection interlayer dielectric 213 formed on the via interlayer dielectric 212b employs a porous insulating film having a relative dielectric constant of 2.37, the formation method of which has been described in Embodiments 1 to 5 of the present invention. The interconnection interlayer dielectric 213 includes upper and lower layers as adhesion layers which are formed with use of a partial pressure control of the raw material. By forming the adhesion layer in the interconnection interlayer dielectric 213 according to the present invention, it is possible to further improve the adhesion even with the via interlayer dielectric 212b formed of SiOCH by the prior art. In the case of the via interlayer dielectric 212b is formed of an SiOCH film, it is not necessary to vary a volume ratio of gases used during deposition of the via interlayer dielectric 212b.

An upper-layer interconnection material includes a Ta/TaN barrier metal 215b and a Cu—Al interconnection 210b as with the lower-layer interconnection material. The Ta/TaN barrier metal is formed by a PVD method. The Cu—Al interconnection 210b contains Cu as a principal component and includes Al at not more than 1.2 atm %.

An upper surface of the upper-layer interconnection is covered with an insulating barrier film 211b. An SiCN film, formed by a plasma CVD method, having a relative dielectric constant of 4.9 is used as the insulating barrier film 211b.

The structure shown in FIG. 22(b) is a structure in which a hard mask film 216a is inserted in the structure shown in FIG. 22(a) to protect a surface (upper surface) of the interconnection interlayer dielectric 213 at the time of Cu-CMP. The hard mask film may employ a silicon oxide film, a silicon carbide film, a silicon carbonitride film, or the like. It is desirable that the hard mask film have a relative dielectric constant and mechanical strength higher than the interconnection interlayer dielectric 213. For example, the hard mask film 216a may employ an SiOCH film formed by a plasma CVD method, such as Aurora-ULK (trademark) or Black Diamond (trademark). Particularly, a conventionally used SiOCH film has a silicon/carbon ratio of about 1. By bringing composition of the upper adhesion layer of the interconnection interlayer dielectric 213 according to the present invention close to the composition of the conventional SiOCH, it is possible to more suitably improve the adhesion between the interconnection interlayer dielectric 213 formed of a porous insulating film and the hard mask film 216a formed of an SiOCH film. Structures other than the above are the same as shown in FIG. 22(a), and the explanation thereof is therefore omitted. In the case where the hard mask film 216a is provided, a volume ratio of gases used during deposition may be varied as with the aforementioned insulating film. Particularly, in the case where the hard mask film 216a is formed of an SiOCH film, it is not necessary to vary a volume ratio of gases used during deposition of the hard mask film 216a.

The structure shown in FIG. 22(c) is a structure in which an etching stopper film 217 is inserted in the structure shown in FIG. 22(b). By inserting the etching stopper film 217 below the interconnection interlayer dielectric 213, it is possible to improve the workability of interconnection trenches and via-holes with a dual damascene shape. It is preferable to change the etching stopper film 217 depending upon materials to be processed. Variations in depth of the interconnection trenches can be reduced by the insertion of the etching stopper film 217. For example, the etching stopper film 217 may employ at least one of an $SiO_2$ film, an SiN film, an SiC film, an SiCN film, an SiOC film, an SiOCH film, and a film including organic matter added thereto, a film including organic matter as a principal component, and a film including SiO added to a film containing organic matter as a principal component.

FIG. 23(a) shows that the via interlayer dielectric 212b in the structure shown in FIG. 22(a) is an insulating film including silicon, oxygen, carbon, and hydrogen and having fewer hydrocarbon components, among insulating films formed by using partial pressure dependency of a raw material of cyclic organosiloxane according to the present invention. It is desirable that the via interlayer dielectric 212b have a film thickness of about 1000 Å to about 3000 Å and a relative dielectric constant not more than 3.0. Furthermore, the interconnection interlayer dielectric 213 is a porous insulating film, formed according to the present invention, including silicon, oxygen, carbon, and hydrogen. The via interlayer dielectric 212b and the interconnection interlayer dielectric 213 are formed continuously. By changing a partial pressure of a raw material during plasma excitation as described in Embodiments 1 to 5, there is formed a structure in which a porous insulating film is interposed between layers having excellent adhesion.

FIG. 23(b) shows that a hard mask film 216a is inserted in the structure shown in FIG. 23(a) to protect a surface of an interconnection interlayer dielectric at the time of Cu-CMP. The hard mask film 216a may be formed by a silicon oxide film, a silicon carbide film, a silicon carbonitride film, or the like. It is desirable that the hard mask film 216a have a relative dielectric constant and mechanical strength higher than the interconnection interlayer dielectric 213. For this purpose, an SiOCH film having a relative dielectric constant of about 3.0 or the like may be used. Structures other than the above are the same as shown in FIG. 23(a), and the explanation thereof is therefore omitted.

FIG. 23(c) shows that an etching stopper film 217b is inserted in the structure shown in FIG. 23(b). By inserting the etching stopper film, it is possible to improve the workability of interconnection trenches and via-holes with a dual damascene shape. It is preferable to change the etching stopper film 217b depending upon materials to be processed. Variations in depth of the interconnection trenches can be reduced by the insertion of the etching stopper film 217b. For example, the etching stopper film may employ at least one of an $SiO_2$ film, an SiN film, an SiC film, and an SiCN film.

FIG. 24(a) shows a structure similar to that of FIG. 22(a) while a via interlayer dielectric 212 is a porous insulating film, formed according to the present invention, including at least silicon, oxygen, carbon, and hydrogen. The via interlayer dielectric 212 and the interconnection interlayer dielectric 213 are formed continuously. By changing a partial pressure of a raw material during plasma excitation as described in Embodiments 1 to 5, there is formed a structure in which a porous insulating film is interposed between layers having excellent adhesion. Furthermore, the interconnection interlayer dielectric 213 is a porous insulating film, formed according to the present invention, including at least silicon, oxygen, carbon, and hydrogen. By changing a partial pressure of a raw material during plasma excitation as described in Embodiments 1 to 5, there is formed a structure in which a porous insulating film is interposed between layers having excellent adhesion.

FIG. 24(b) shows a structure in which a hard mask film 216a is inserted in the structure shown in FIG. 24(a) to protect a surface of an interconnection interlayer dielectric at the time of Cu-CMP. The hard mask film may be formed by a silicon oxide film, a silicon carbide film, a silicon carbonitride film, or the like. It is desirable that the hard mask film 216a have a relative dielectric constant and mechanical strength higher than the interconnection interlayer dielectric 213. For this purpose, an SiOCH film having a relative dielectric constant of about 3.0 or the like may be used. Structures other than the above are the same as shown in FIG. 22(a), and the explanation thereof is therefore omitted.

FIG. 24(c) shows that an etching stopper film 217 is inserted in the structure shown in FIG. 24(b). By inserting the etching stopper film, it is possible to improve the workability of interconnection trenches and via-holes with a dual damascene shape. It is preferable to change the etching stopper film 217 depending upon materials to be processed. Variations in depth of the interconnection trenches can be reduced by the insertion of the etching stopper film 217. For example, the etching stopper film may employ at least one of an $SiO_2$ film, an SiN film, an SiC film, and an SiCN film.

With the above interconnection structures, it is possible to achieve reduction of the capacity between interconnections.

Although the embodiments of the present invention have been described with regard to a dual damascene structure, it is apparent that the present invention is also applicable to a single damascene interconnection.

EXAMPLES

A formation method of a porous insulating film, a semiconductor device, and a manufacturing method of a semiconductor device according to the present invention will be described below with reference to specific examples.

Example 1

Figure 25:
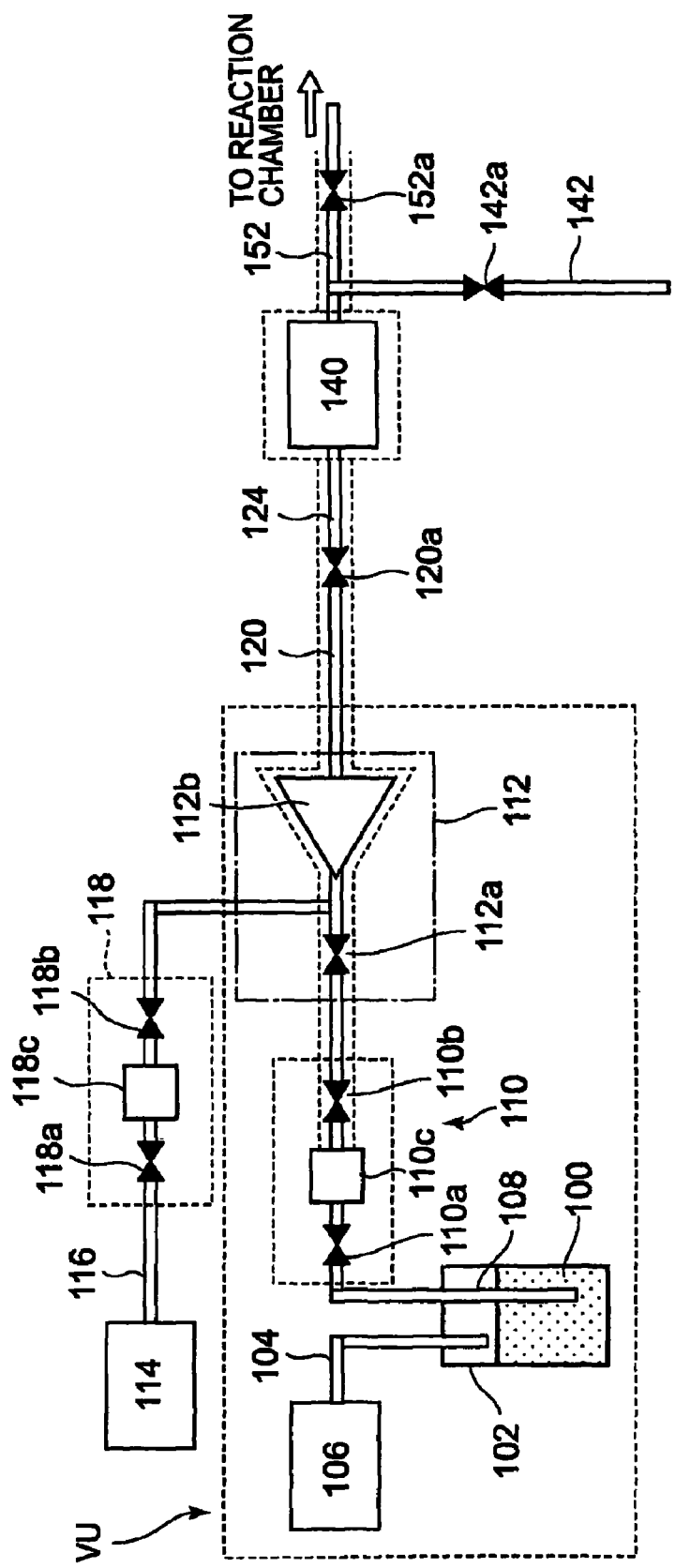
FIG. 25 is a schematic view showing an example of a main portion of a gas supply portion for forming a porous insulating film.

An example in which a gaseous raw material is supplied to a reaction chamber to form a porous insulating film will be described below as an example of the present invention with reference to FIG. 25. FIG. 25 is a schematic view showing an example of a main portion of a gas supply portion suitable for use in a case where cyclic organosiloxane to be used as a raw material gas has a low boiling point but is in a liquid state when it is not heated in an artificial way.

A vaporization control unit VU has a raw material tank 102 for receiving a liquid raw material of cyclic organosiloxane (mixed raw material) 100, a pressurized gas supply apparatus 106 for supplying a pressurized gas into the raw material tank 108 through a pressurized gas supply pipe 104, a raw material transfer pipe 108 having an end inserted in the raw material tank 102, a liquid flow control portion 110 provided on the raw material transfer pipe 108, and a vaporization portion 112 disposed at another end of the raw material transfer pipe 108. The liquid flow control portion 110 has two valves 110a and 110b and a liquid flow controller 110c disposed between the valves 110a and 110b. The vaporization portion 112 has a valve 112a provided at the other end of the raw material transfer pipe 108 and a vaporizer 112b connected to the other end of the raw material transfer pipe 108.

Furthermore, each vaporization control unit VU has a gas supply tank 114 for a carrier gas (hereinafter referred to as "inert gas supply tank 114") and a pipe 116 for supplying the carrier gas to the vaporizer 112. A gas flow control portion 118, which has two valves 118a, 118b, and a gas flow controller 118c disposed between the valves 118a and 118b, is provided on the pipe 116.

When a pressurized gas is supplied from the pressurized gas supply apparatus 106 through the pressurized gas supply pipe 104 to the raw material tank 102, the internal pressure of the raw material tank 102 is increased, so that the liquid mixed raw material 100 in the raw material tank 102 is transferred through the raw material transfer pipe 108 to the vaporization portion 112. The carrier gas or inert gas is joined to the mixed raw material 100 before the vaporization portion 112, and the mixed raw material 100 then reaches the vaporization portion 112. The liquid mixed raw material 100 that has reached the vaporization portion 112 is vaporized by pressure reduction at an inlet portion of the vaporization portion 112 and heat of a heater (not shown).

The gas generated in the vaporization control unit VU is transferred to a gas discharge pipe 120 connected to the vaporization portion 112. Then the gas reaches a mixer 140 through a pipe 124 and is mixed with an addition gas or the like.

In view of smooth vaporization in each vaporizer 112, it is desirable to provide a heater around the raw material compound transfer pipe 108 at the downstream side of the liquid flow controller 110c in the liquid flow control portion 110 to thereby heat the raw material compound transfer pipe 108. Similarly, in order to prevent each gas from being liquefied, it is desirable to provide a heater around each of gas discharge pipes 120, 152, and the mixer 140 to thereby heat the gas discharge pipes 120, 152, and the mixer 140.

By using such a deposition apparatus with a gas supply portion having the aforementioned arrangement, a desired porous insulating film can readily be obtained in a case where a raw material to be used as a raw material gas has a low boiling point but is in a liquid state when it is not heated in an artificial way.

In this example, a plasma CVD apparatus employed a reaction chamber for 200-mm wafers. A raw material having a structure expressed by the chemical structure formula (4) was used as cyclic organosiloxane. In order to vary a partial pressure of the raw material during deposition, the amount of supply was constant at 65 sccm. Helium was used as an inert carrier gas, and the amount of supply was varied to 300-1500 sccm. Helium may not necessarily be supplied as a carrier gas through a vaporizer, and a portion of He may be supplied directly to the reaction chamber. The substrate temperature was 350° C., the distance between electrodes was 10 mm, and the RF power applied to the showerhead was 90 W at 13.5 MHz. Silicon substrates were used as substrates for deposition experiments.

Figure 26:
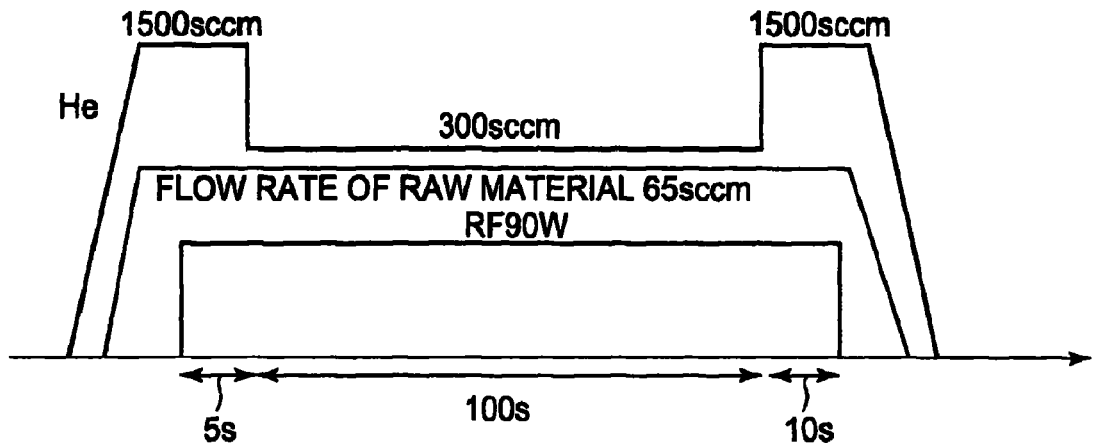
FIG. 26 is a time chart showing time variations of a flow rate of a raw material to be supplied to a reaction chamber in a deposition process of Example 1, a flow rate of an inert gas, an RF power, and a pressure of the reaction chamber.

FIG. 26 summarizes the deposition process. First, a raw material of cyclic organosiloxane and a carrier gas of He were supplied to the reaction chamber in a state such that the pressure of the reaction chamber could be maintained at 2.7 Torr.

At that time, it is desirable that supply of the He gas at 1500 sccm be started at first, and then supply of the raw material of cyclic organosiloxane be started when the pressure of the reaction chamber is stabilized. It took about 10 seconds that the amount of the raw material of cyclic organosiloxane supplied reached a desired amount of supply. This was to prevent clogging of the vaporizer due to polymerization of the raw material in the vaporizer.

At that time, He was supplied through the raw material vaporizer at 300 sccm and supplied directly to the reaction chamber through a separate line at 1200 sccm. The control of the flow rate of He subsequently supplied to the reaction chamber was performed by controlling the amount of He supplied through the separate line. The flow rate of He supplied to the vaporizer was constant at 300 sccm. Thus, by adjusting the amount of He supplied through the vaporizer at a constant value, it is possible to stabilize the temperature in the vaporization portion 112 and achieve stable supply of the raw material.

Subsequently, when the supply of He and the raw material was stabilized and the pressure of the reaction chamber became constant, application of the RF power was started. An adhesion layer of 5 nm was formed by continuing power application for 5 seconds. Then the flow rate of the He gas was changed to 300 sccm. Subsequently, a porous insulating film layer of 120 nm was formed by continuing the application of the RF power for 100 seconds. Next, the flow rate of the He gas was changed again to 1500 sccm. An upper adhesion layer of 7 nm was formed by applying the RF power for 10 seconds. Then the power application was stopped. The pressure changes during these steps were all performed while the RF power was continuously applied. Thereafter, purge and discharge of the reaction chamber was repeated, and the wafer was taken out of the reaction chamber.

The film thus obtained had a relative dielectric constant of 2.45. When the adhesion with the silicon oxide film was measured by the m-ELT test, it was confirmed that the adhesion was improved by about 10% as compared to the case where no adhesion layers were inserted.

Example 2

In this example, a raw material having a structure expressed by the chemical structure formula (2) was used as cyclic organosiloxane. In order to vary a partial pressure of the raw material, the amount of supply was in a range of 15 sccm to 65 sccm. The substrate temperature was 350° C., the distance between electrodes was 10 mm, and the RF power applied to the showerhead was 90 W at 13.5 MHz. The total pressure of the reaction chamber was constant at 2.7 Torr, and the amount of supply of the He inert carrier gas was 300 sccm.

Figure 27:
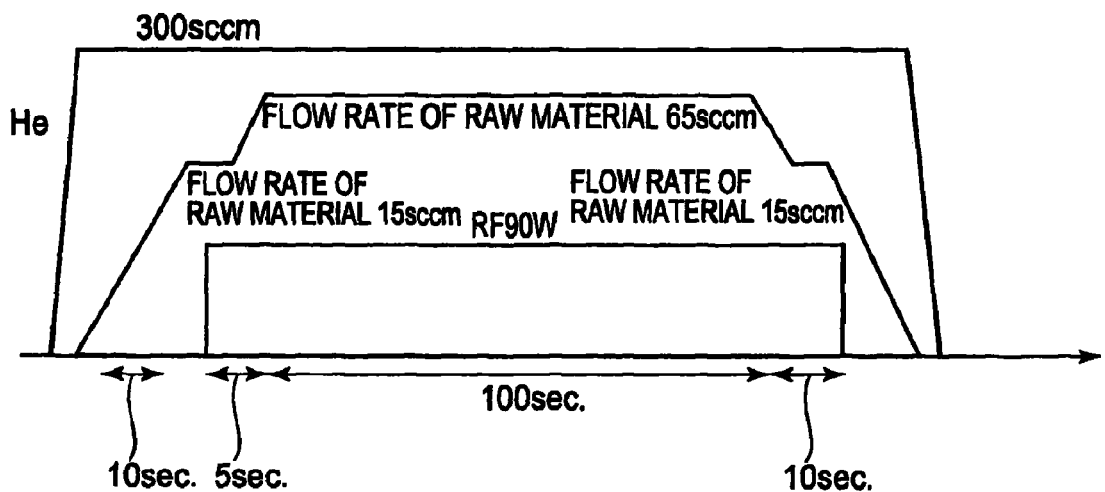
FIG. 27 is a time chart showing time variations of a flow rate of a raw material to be supplied to a reaction chamber in a deposition process of Example 2, a flow rate of an inert gas, an RF power, and a pressure of the reaction chamber.

FIG. 27 summarizes the deposition process. First, a raw material of cyclic organosiloxane and a He carrier gas were supplied to the reaction chamber at 15 sccm and 300 sccm, respectively, in a state such that the pressure of the reaction chamber could be maintained at 2.7 Torr.

Subsequently, when the supply of He and the raw material was stabilized and the pressure of the reaction chamber became constant, application of the RF power was started. An adhesion layer of about 6 nm was formed by continuing power application for 4 seconds. Then the amount of supply of the raw material was changed to 65 sccm. Subsequently, a porous insulating film layer of 120 nm was formed by continuing the application of the RF power for 100 seconds. Next, the amount of supply of the raw material was changed again to 15 sccm. An upper adhesion layer of 10 nm was formed by applying the RF power for 8 seconds. Then the power application was stopped. The pressure changes during these steps were all performed while the RF power was continuously applied. Thereafter, purge and discharge of the reaction chamber was repeated, and the wafer was taken out of the reaction chamber.

The film thus obtained had a relative dielectric constant of 2.47. When the adhesion with the silicon oxide film was measured by the m-ELT test, it was confirmed that the adhesion was improved by about 18% as compared to the case where no adhesion layers were formed. The response to the change of the flow rate of the raw material was slower as compared to the response to the partial pressure change of the raw material with use of the flow rate of He in Example 1. Therefore, control by the change of the flow rate of He as in Example 1 is preferable if a steeper change in the multilayer structure is needed.

Both of the amount of supply of the raw material and the amount of supply of He may be changed so as to change the partial pressure of the raw material, the details of which are not described herein. The total pressure of the reaction chamber may properly be changed to maintain good uniformity of the film thickness within the wafer.

Figure 28:
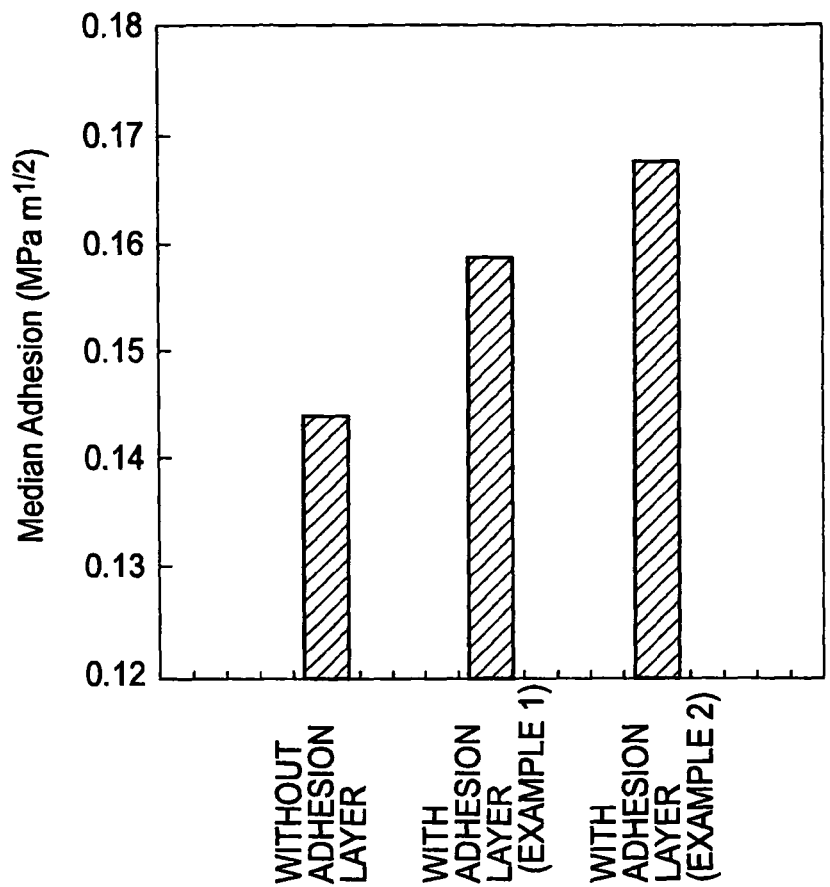

The results of adhesion measurement in Examples 1 and 2 are collectively shown in FIG. 28, together with the results of the case of no adhesion layers.

Example 3

In this example, a raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was 90 W at 13.5 MHz. In order to vary the partial pressure of the raw material, the flow rate of the He inert carrier gas was also changed in a range of 300 sccm to 1500 sccm.

Figure 29:
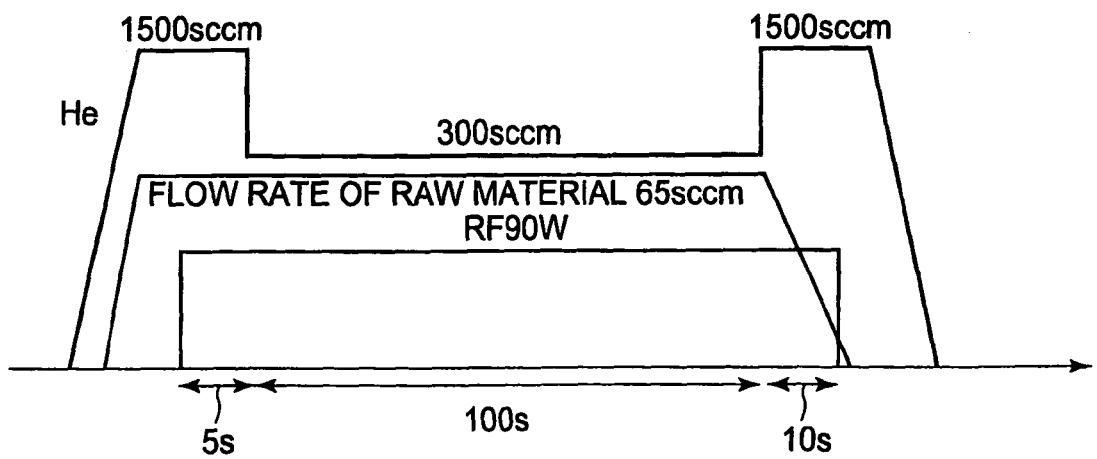
FIG. 29 is a time chart showing time variations of a flow rate of a raw material to be supplied to a reaction chamber in a deposition process of Example 3, a flow rate of an inert gas, an RF power, and a pressure of the reaction chamber.

FIG. 29 summarizes the deposition process. First, a raw material of cyclic organosiloxane and a He carrier gas were supplied to the reaction chamber at 65 sccm and 1500 sccm, respectively, in a state such that the pressure of the reaction chamber could be maintained at 2.7 Torr. The He carrier gas was supplied in the same manner as in Example 1.

Subsequently, when the supply of He and the raw material was stabilized and the pressure of the reaction chamber became constant, application of the RF power was started. An adhesion layer was formed by continuing power application for 5 seconds. Then the flow rate of He was changed to 300 sccm. Subsequently, a porous insulating film layer was formed by continuing the application of the RF power for 100 seconds. Next, the flow rate of He was changed again to 1500 sccm, and the supply of the raw material is simultaneously stopped. The raw material remaining in the pipe was supplied even though the supply of the raw material had been stopped. Practically, therefore, the amount of supply of the raw material was gradually reduced in about several seconds. In this state, an upper adhesion layer was formed by applying the RF power for 10 seconds. Then the power application was stopped. The pressure changes during these steps were all performed while the RF power was continuously applied. Thereafter, purge and discharge of the reaction chamber was repeated, and the wafer was taken out of the reaction chamber.

The film thus obtained had a relative dielectric constant of 2.45. When the adhesion with the silicon oxide film was measured by the m-ELT test, it was confirmed that the adhesion was improved by about 20% as compared to the case where no adhesion layers were formed. As to the portion of the upper adhesion layer, the flow rate of the raw material was reduced as compared to Example 1. Therefore, the partial pressure of the raw material was lowered, so that a layer having excellent adhesion could be formed.

Example 4

In this example, a raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was in a range of 90 W to 150 W at 13.5 MHz. In order to vary the partial pressure of the raw material, the flow rate of the He inert carrier gas was changed in a range of 300 sccm to 1500 sccm.

Figure 30:
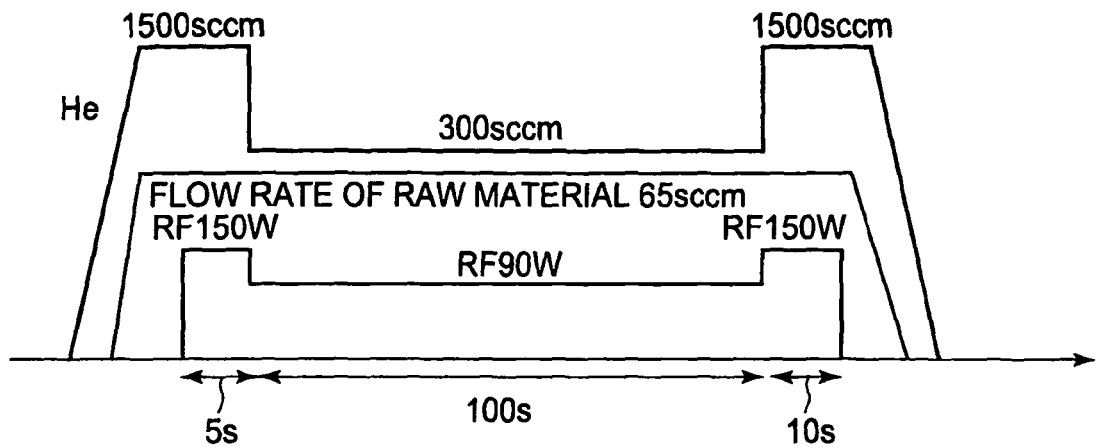
FIG. 30 is a time chart showing time variations of a flow rate of a raw material to be supplied to a reaction chamber in a deposition process of Example 4, a flow rate of an inert gas, an RF power, and a pressure of the reaction chamber.

FIG. 30 summarizes the deposition process. First, a raw material of cyclic organosiloxane and a He carrier gas were supplied to the reaction chamber at 65 sccm and 1500 sccm, respectively, in a state such that the pressure of the reaction chamber could be maintained at 2.7 Torr. The He carrier gas was supplied in the same manner as in Example 1.

Subsequently, when the supply of He and the raw material was stabilized and the pressure of the reaction chamber became constant, application of the RF power of 150 W was started. An adhesion layer was formed by continuing power application for 5 seconds. Then the pressure of the reaction chamber was maintained at 2.7 Torr, the flow rate of He was changed to 300 sccm, and the RF power was changed to 90 W. If the applied power is excessively high, the plasma is not ignited, so that the process becomes unstable. These phenomena depend upon the flow rate of the raw material, the flow rate of He, and the pressure of the chamber. Accordingly, a power of 150 W was selected under the conditions described in this example.

Subsequently, a porous insulating film layer was formed by continuing the application of the RF power at 2.7 Torr for 100 seconds. Next, the flow rate of He was changed again to 1500 sccm, and the RF power was changed to 150 W. In this state, an upper adhesion layer was formed by applying the RF power for 10 seconds. Then the power application was stopped. The partial pressure changes of the raw material during these steps were all performed while the RF power was continuously applied. Thereafter, purge and discharge of the reaction chamber was repeated, and the wafer was taken out of the reaction chamber.

The film thus obtained had a relative dielectric constant of 2.47. When the adhesion with the silicon oxide film was measured by the m-ELT test, it was confirmed that the adhesion was improved by about 25% as compared to the case where no adhesion layers were formed.

Example 5

In this example, a raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was 90 W at 13.5 MHz. In order to vary the partial pressure of the raw material, the flow rate of the He inert carrier gas was changed in a range of 300 sccm to 1500 sccm, and the flow rate of oxygen was changed in a range of 0 sccm to 5 sccm.

Figure 31:
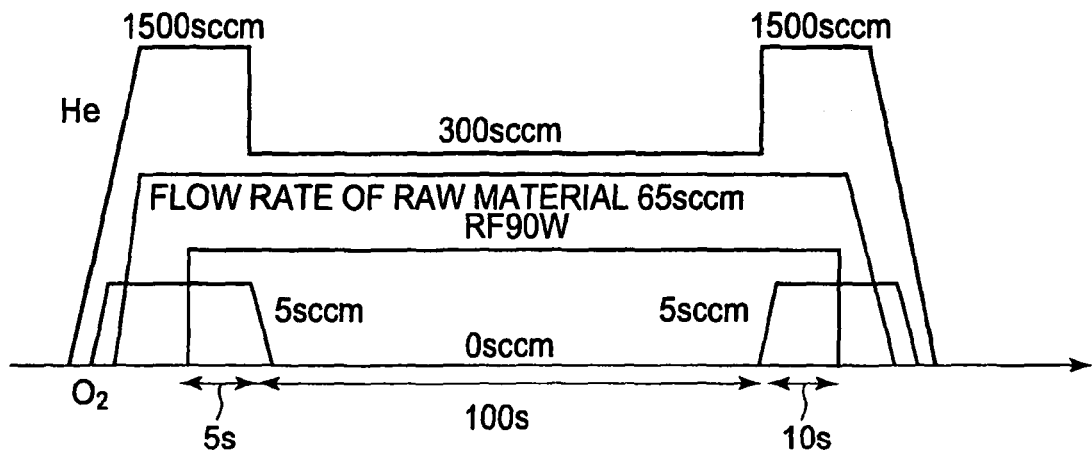
FIG. 31 is a time chart showing time variations of a flow rate of a raw material to be supplied to a reaction chamber in a deposition process of Example 5, a flow rate of an inert gas, an RF power, and a pressure of the reaction chamber.

FIG. 31 summarizes the deposition process. First, a raw material of cyclic organosiloxane, a He carrier gas, and oxygen were supplied to the reaction chamber at 65 sccm, 1500 sccm, and 5 sccm, respectively, in a state such that the pressure of the reaction chamber could be maintained at 2.7 Torr. The He carrier gas was supplied in the same manner as in Example 1.

Subsequently, when the supply of He and the raw material was stabilized and the pressure of the reaction chamber became constant, application of the RF power of 90 W was started. An adhesion layer was formed by continuing power application for 3 seconds. Then the pressure of the reaction chamber was maintained at 2.7 Torr, the flow rate of He was changed to 300 sccm, the RF power was maintained at 90 W, and the flow rate of oxygen was changed to 0 sccm. In this state, a porous insulating film layer was formed by continuing the application of the RF power for 100 seconds. Next, the flow rate of He was changed to 1500 sccm, the RF power was changed to 150 W, and the flow rate of oxygen was changed to 5 sccm. In this state, an upper adhesion layer was formed by applying the RF power for 5 seconds. Then the power application was stopped. The pressure changes during these steps were all performed while the RF power was continuously applied. Thereafter, purge and discharge of the reaction chamber was repeated, and the wafer was taken out of the reaction chamber.

The film thus obtained had a relative dielectric constant of 2.49. When the adhesion with the silicon oxide film was measured by the m-ELT test, it was confirmed that the adhesion was improved by about 27% as compared to the case where no adhesion layers were formed.

Example 6

In this example, a raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was 90 W at 13.5 MHz. The low-frequency power to the substrate was changed in a range of 0 W to 50 W at 4.2 kHz. In order to vary the partial pressure of the raw material, the flow rate of the He inert carrier gas was changed in a range of 300 sccm to 1500 sccm.

Figure 32:
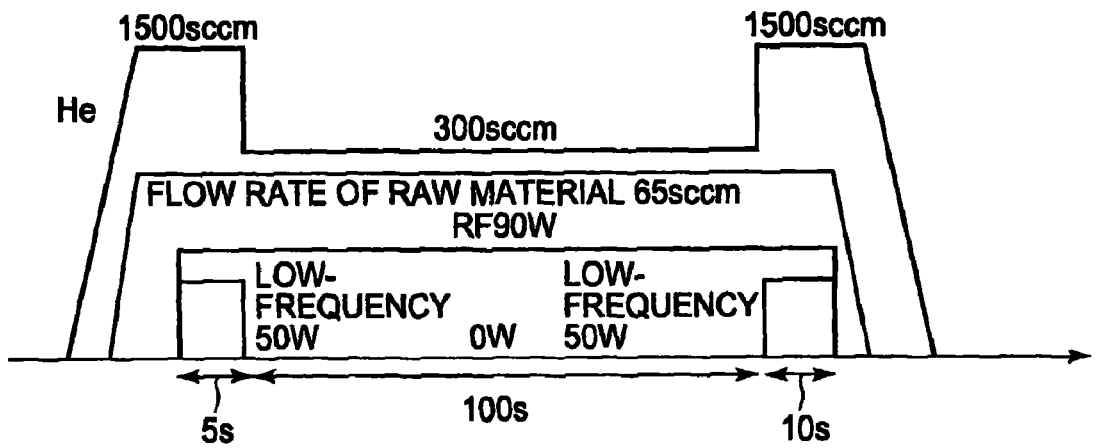
FIG. 32 is a time chart showing time variations of a flow rate of a raw material to be supplied to a reaction chamber in a deposition process of Example 6, a flow rate of an inert gas, an RF power, and a pressure of the reaction chamber.

FIG. 32 summarizes the deposition process. First, a raw material of cyclic organosiloxane and a He carrier gas were supplied to the reaction chamber at 65 sccm and 1500 sccm, respectively, in a state such that the pressure of the reaction chamber could be maintained at 1.0 Torr. The He carrier gas was supplied in the same manner as in Example 2.

Subsequently, when the supply of He and the raw material was stabilized and the pressure of the reaction chamber became constant, application of the RF power of 90 W and application of the low-frequency power of 50 W were started. An adhesion layer was formed by continuing power application for 5 seconds. Then the flow rate of He was changed to 300 sccm, the RF power was maintained at 90 W, and the low-frequency power was changed to 0 W. In this state, a porous insulating film layer was formed by continuing the application of the RF power of 90 W for 100 seconds. Next, the flow rate of He carrier gas was changed again to 1500 sccm, the RF power was maintained at 90 W, and the low-frequency power was changed to 50 W. In this state, an upper adhesion layer was formed by applying the RF power for 10 seconds. Then the power application was stopped. The pressure changes during these steps were all performed while the RF power was continuously applied. Thereafter, purge and discharge of the reaction chamber was repeated, and the wafer was taken out of the reaction chamber.

The film thus obtained had a relative dielectric constant of 2.49. When the adhesion with the silicon oxide film was measured by the m-ELT test, it was confirmed that the adhesion was improved by about 20% as compared to the case where no adhesion layers were formed.

Example 7

In this example, not only an adhesion layer but also a via interlayer dielectric was deposited under conditions of a low partial pressure of a raw material, and then an interconnection interlayer dielectric was successively formed. A raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was in a range of 90 W to 150 W at 13.5 MHz. In order to vary the partial pressure of the raw material, the flow rate of the inert gas He was changed in a range of 300 sccm to 1500 sccm.

Figure 33:
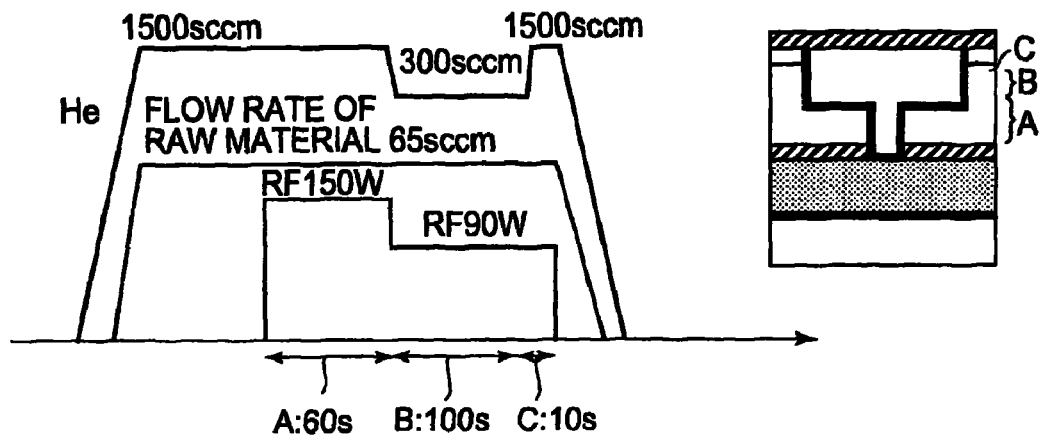
FIG. 33 is a time chart showing time variations of a flow rate of a raw material to be supplied to a reaction chamber in a deposition process of Example 7, a flow rate of an inert gas, an RF power, and a pressure of the reaction chamber, and a diagram summarizing a formed interconnection structure.

FIG. 33 summarizes the deposition process and the formed interconnection structure. First, a raw material of cyclic organosiloxane and a He carrier gas were supplied to the reaction chamber at 65 sccm and 1500 sccm, respectively, in a state such that the pressure of the reaction chamber could be maintained at 2.7 Torr. The He carrier gas was supplied in the same manner as in Example 1.

Subsequently, when the supply of He and the raw material was stabilized and the pressure of the reaction chamber became constant, application of the RF power of 150 W was started. A via layer (layer A) of 150 nm was formed by continuing the power application for 60 seconds. Then the flow rate of He was changed to 300 sccm, and the RF power was changed to 90 W. In this state, a porous insulating film layer (layer B) of 130 nm was formed by continuing the application of the RF power of 90 W for 115 seconds. Next, the flow rate of He was changed again to 1500 sccm, and the RF power was changed to 150 W. In this state, an upper adhesion layer (layer C) of 10 nm was formed by applying the RF power for 10 seconds. Then the power application was stopped. The pressure changes during these steps were all performed while the RF power was continuously applied. Thereafter, purge and discharge of the reaction chamber was repeated, and the wafer was taken out of the reaction chamber.

When the adhesion of the film thus obtained with the silicon oxide film was measured by the m-ELT test, it was confirmed that the adhesion was improved by about 20% as compared to the case where no adhesion layers were formed.

Example 8

In this example, not only an adhesion layer but also a via interlayer dielectric was deposited under conditions of a low partial pressure of a raw material while adding oxygen, and then an interconnection interlayer dielectric was successively formed. A raw material having a structure expressed by the chemical structure formula (2) was used as cyclic organosiloxane, and the amount of supply was 65 sccm. The substrate temperature was 350° C., the distance between electrodes was 10 mm, and the RF power applied to the showerhead was in a range of 90 W to 150 W at 13.5 MHz. In order to vary the partial pressure of the raw material, the flow rate of the inert gas He was changed in a range of 300 sccm to 1500 sccm, and the flow rate of oxygen was changed in a range of 0 sccm to 5 sccm.

Figure 34:
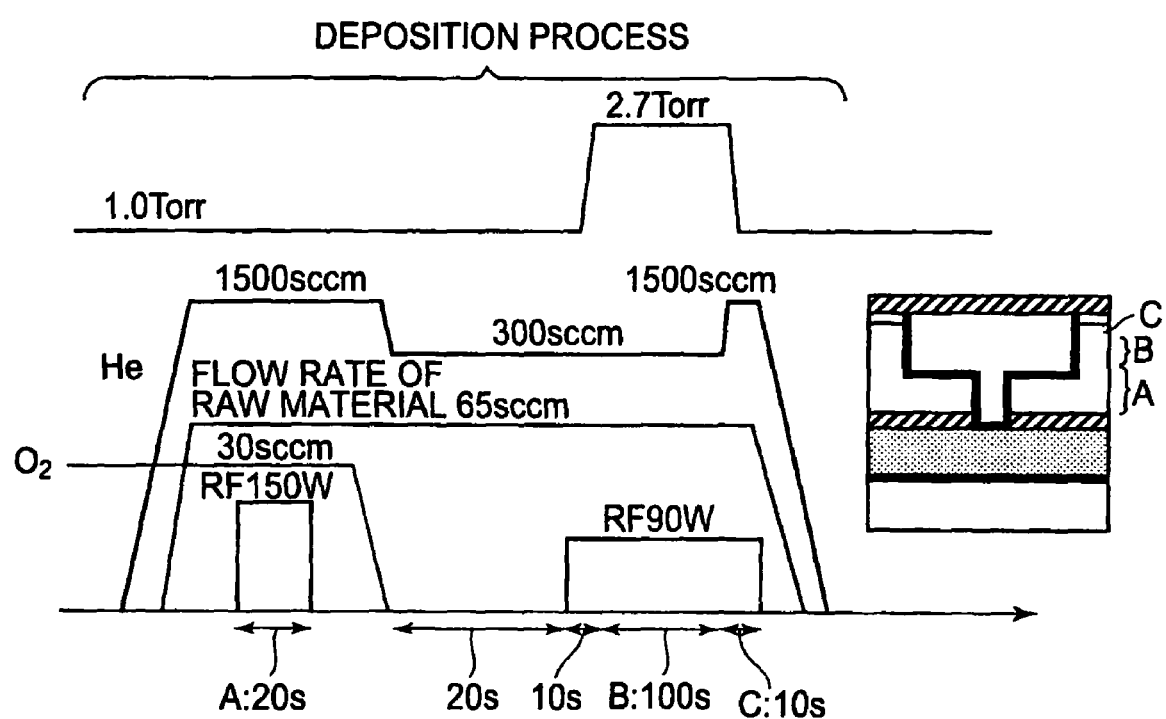
FIG. 34 is a time chart showing time variations of a flow rate of a raw material to be supplied to a reaction chamber in a deposition process of Example 8, a flow rate of an inert gas, an RF power, and a pressure of the reaction chamber, and a diagram summarizing a formed interconnection structure.

FIG. 34 summarizes the deposition process and the formed interconnection structure. First, a raw material of cyclic organosiloxane, a He carrier gas, and oxygen were supplied to the reaction chamber at 65 sccm, 1500 sccm, and 5 sccm, respectively, in a state such that the pressure of the reaction chamber could be maintained at 1.5 Torr. The He carrier gas was supplied in the same manner as in Example 2.

Subsequently, when the flow rate of each gas was stabilized and the pressure of the reaction chamber became constant, application of the RF power of 150 W was started. A via layer (layer A) of 150 nm was formed by continuing the power application for 20 seconds. Then the pressure of the reaction chamber was changed to 2.7 Torr, the flow rate of He was changed to 300 sccm, the RF power was changed to 90 W, and the flow rate of oxygen was changed to 0 sccm. A porous insulating film layer (layer B) of 130 nm was formed by continuing the application of the RF power of 90 W at 2.7 Torr for 100 seconds. Next, the flow rate of He was changed again to 1500 sccm, the RF power was changed to 150 W, and the flow rate of oxygen was changed to 5 sccm. In this state, an upper adhesion layer (layer C) of 15 nm was formed by applying the RF power for 10 seconds. Then the power application was stopped. The pressure changes during these steps were all performed while the RF power was continuously applied. Thereafter, purge and discharge of the reaction chamber was repeated, and the wafer was taken out of the reaction chamber.

When the adhesion of the film thus obtained with the silicon oxide film was measured by the m-ELT test, it was confirmed that the adhesion was improved by about 30% as compared to the case where no adhesion layers were formed.

Example 9

In Example 9 of the present invention, there will be described an interconnection structure in which a porous insulating film formed according to the present invention is used as a multilayer interconnection on a semiconductor substrate on which a semiconductor device was formed.

Figure 35:
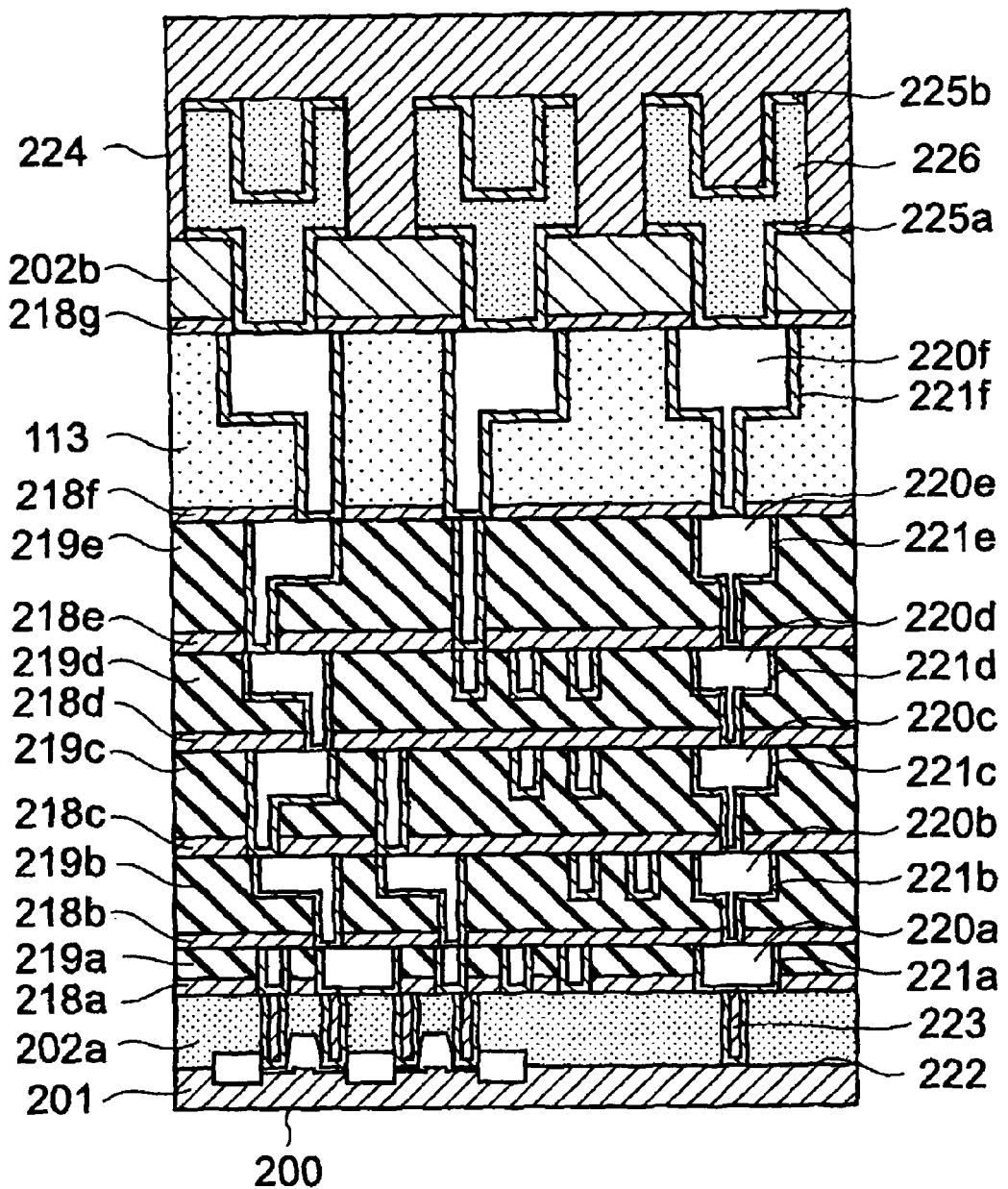
FIG. 35 is a diagram showing an example of an interconnection structure that used a porous insulating film formed according to the present invention as a multilayer interconnection on a semiconductor substrate on which a semiconductor device was formed.

As shown in FIG. 35, metal interconnection materials 220a-220f and insulating barrier films 218a-218g are stacked on a semiconductor substrate 201 on which a semiconductor device (MOSFET 200) is formed. Via interlayer dielectrics and interconnection interlayer dielectrics 219a-219e are formed on those films.

Here, the metal interconnection materials 220a-220f contain Cu as a principal component. In order to improve the reliability of the metal interconnection material, a metal element other than Cu may be included in a member made of Cu. A metal element other than Cu may be formed on an upper surface or a side surface of Cu. In this example, Cu—Al was used for the metal interconnection materials 220a-220f.

The insulating barrier films 218a-218g are formed of SiCN films by a plasma CVD method. The insulating barrier films 218a-218g have a film thickness of 300 Å.

The porous interlayer dielectrics 219a-219e include a via interlayer dielectric, an interconnection interlayer dielectric, and an upper adhesion layer. The porous interlayer dielectrics 219a-219e are insulating films, formed continuously by the method described in Example 7 of the present invention, including silicon, oxygen, carbon, and hydrogen. The via interlayer dielectric has a relative dielectric constant of 2.7 and a film thickness of 120 nm. The interconnection interlayer dielectric has a relative dielectric constant of 2.45 and a film thickness of 130 nm. The metal interconnection materials 220a-220f and barrier metals 221a-221f are embedded in the dual damascene trenches formed by those interlayer dielectrics.

The barrier metal films 221a-221f are multilayered films of Ta (15 nm)/TaN (5 nm) (=upper layer/lower layer) formed by a PVD method.

A Cu target containing Al at not more than 1.5 atm % is formed by a PVD method, and the metal interconnection materials 220a-220f are formed by a plating method.

Each of the interconnection layers 220a-220e (M1-M5) has a height of 170 nm, and the interconnection layer 220f (M6) has a height of 300 nm.

Here, hard mask films or the like may be inserted to protect surfaces of the interconnection interlayer dielectrics 219a-219e at the time of Cu-CMP The hard mask film may employ a silicon oxide film, a silicon carbide film, a silicon carbonitride film, or the like. It is desirable that the hard mask films have a relative dielectric constant and mechanical strength higher than the interconnection interlayer dielectrics 219a-219e. For this purpose, the hard mask films may employ SiOCH films having a relative dielectric constant of about 3.0.

The upper-layer interconnections employ Al. A Ti/TiN film 225a, an Al—Cu film 226, and a Ti/TiN film 225b are formed by a PVD method. As to the thickness of those metal films, the Ti/TiN film 225a is about 0.3 μm, the Al—Cu film 226 is 1.5 μm, and the TiN film 225b is 0.3 μm. At that time, metal was continuously embedded in the groove-like via holes. The upper layer thereof was covered with a passivation film.

With the above interconnection structure, it is possible to achieve reduction of the capacity between interconnections by introducing the porous insulating film. Furthermore, when a TDDB test was conducted between the interconnections with a comb-like TEG having wiring pitches of 70 nm and an electric field of 3 MV/cm was applied at 125° C., the insulation life was at least 60 hours. Thus, the sufficient TDDB resistance was confirmed.

Moreover, after such a device was formed, the wafer was subjected to dicing so as to cut chips. Then the chips were mounted and molded with resin on ceramic packages. The size of the chips was 20 mm square. When a temperature cycling test of −65° C. to 150° C. was conducted, no peeling was observed in any one of ten chips in the case of the interlayer film structure improved in adhesion by using partial pressure changes of the raw material according to the present invention. By contrast, in a case of a conventional film structure having low adhesion, it was confirmed that some peeling was caused in corners of two samples of the chips.

This example has been described in detail with regard to the dual damascene structure. It is apparent that the present invention is applicable to a single damascene interconnection in a similar manner.

The present invention can be applied to any interconnection structure of multilayer interconnections in which improvement of the adhesion of a porous insulating film is required and to any manufacturing method of such an interconnection structure. In the possibility of use, the present invention is not limited in any way.

The present invention has been described in connection with some preferred embodiments. However, it should be understood that those embodiments and examples merely exemplify the present invention and do not intend to limit the present invention.

For example, the present invention has been described in detail with respect to semiconductor fabrication apparatus technology with a CMOS circuit, which is the application field in the background of the invention made by the inventors. However, the present invention is not limited to this technology. For example, the present invention can be applied to semiconductor products having a memory circuit such as a DRAM (Dynamic Random Access Memory), an SRAM (Static Random Access Memory), a flash memory, an FRAM (Ferro-Electric Random Access Memory), an MRAM (Magnetic Random Access Memory), and a resistance random access memory, semiconductor products having a logic circuit such as a microprocessor, or a combined semiconductor products including those semiconductor products simultaneously mounted. Furthermore, the present invention is also applicable to a semiconductor device, an electronic circuit device, an optical circuit device, a quantum circuit device, and a micromachine which at least partially have an embedded type alloy interconnection structure, and the like.

Furthermore, formation of a porous insulating film according to the present invention can be confirmed after the completion. Specifically, with regard to interconnection interlayer films, upper and lower adhesion layers of a porous insulating film can be confirmed by contrast of observation images with a TEM (Transmission Electron Microscope). Elements Si, O, and C can be confirmed by elementary analysis such as EDX (Energy Dispersive X-ray Fluorescence Spectrometer) or EELS (Electron Energy Loss Spectroscopy) in addition to the TEM. Identification can be performed by whether the adhesion layer has a high density or whether the content of carbon and hydrogen is less than that inside of the porous insulating film.

Moreover, formation of a porous insulating film according to the present invention can be confirmed by confirmation of a control program of a microcomputer stored within a semiconductor fabrication apparatus. Identification can be performed by whether a program controlled so that a partial pressure of a raw material is changed during deposition of the porous insulating film is used or whether such a program is stored.

After reading the specification, it is apparent to those skilled in the art that various variations or replacements can readily be made with equivalent components or techniques. It is evident that such variations or replacements fall within the true scope and spirit of the appended claims.

The invention claimed is:

1. A manufacturing method of a semiconductor device having a multilayer interconnection structure including an insulating film deposited by a plasma vapor deposition method with supplying at least an organosiloxane and an inert gas to a reaction chamber, comprising:
varying a volume ratio of the organosiloxane and the inert gas to be supplied during deposition of the insulating film to change a partial pressure of the organosiloxane in the reaction chamber,
whereby a plurality of layers having different film characteristics are formed in the insulating film.

2. The manufacturing method of a semiconductor device as recited in claim 1, wherein the organosiloxane comprises cyclic organosiloxane including at least silicon, oxygen, carbon, and hydrogen.

3. The manufacturing method of a semiconductor device as recited in claim 1, wherein a total pressure of the reaction chamber is constant during deposition.

4. The manufacturing method of a semiconductor device as recited in claim 1, wherein the organosiloxane has a structure expressed by the following chemical structure formula (1):

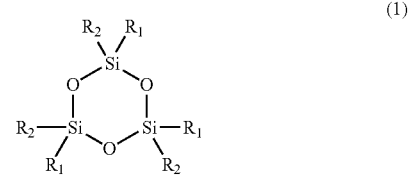

(1)

where R1 and R2 are one of a methyl group, an ethyl group, a propyl group, an isopropyl group, a vinyl group, and an allyl group.

5. The manufacturing method of a semiconductor device as recited in claim 1, wherein the organosiloxane has a structure expressed by any of the following chemical structure formulas (2)-(4):

chemical structure formula (2):

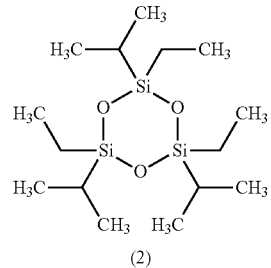

(2)

-continued chemical structure formula (3):

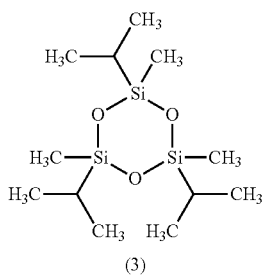

(3)

chemical structure formula (4):

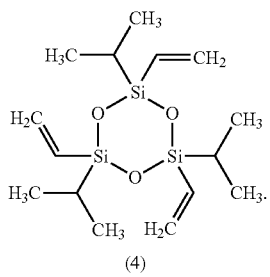

(4)

6. The manufacturing method of a semiconductor device as recited in claim 1, wherein at least one of He, Ne, Ar, Kr, Xe, and Rn is used as the inert gas.

7. The manufacturing method of a semiconductor device as recited in claim 1, the plasma vapor deposition method comprising:
  (i) a process to excite plasma; and
  (ii) a process to maintain the plasma,
  wherein the partial pressure of the organosiloxane in (ii) the process to maintain the plasma is higher than that in (i) the process to excite the plasma.

8. The manufacturing method of a semiconductor device as recited in claim 7, wherein a volume ratio of the organosiloxane to the inert gas in at least (ii) the process to maintain the plasma is not less than 0.1.

9. The manufacturing method of a semiconductor device as recited in claim 7, wherein plasma power in (ii) the process to maintain the plasma is lower than that in the other process.

10. The manufacturing method of a semiconductor device as recited in claim 1, the plasma vapor deposition method comprising:
  (ii) a process to maintain plasma; and
  (iii) a process to extinguish the plasma,
  wherein the partial pressure of the organosiloxane in (ii) the process to maintain the plasma is higher than that in (iii) the process to extinguish the plasma.

11. The manufacturing method of a semiconductor device as recited in claim 1, the plasma vapor deposition method comprising:
  (i) a process to excite plasma;
  (ii) a process to maintain the plasma; and
  (iii) a process to extinguish the plasma,
  wherein the partial pressure of the organosiloxane in (ii) the process to maintain the plasma is higher than that in the other processes.

12. The manufacturing method of a semiconductor device as recited in claim 1, wherein a volume ratio of the organosiloxane to the inert gas in at least (i) the process to excite the plasma or (iii) the process to extinguish the plasma is less than 0.1.

13. The manufacturing method of a semiconductor device as recited in claim 11, wherein a low-frequency power is applied to a substrate in at least (i) the process to excite the plasma or (iii) the process to extinguish the plasma.

14. The manufacturing method of a semiconductor device as recited in claim 1, wherein the control of the partial pressure of the organosiloxane is performed by changing a flow rate of the inert gas.

15. The manufacturing method of a semiconductor device as recited in claim 1, wherein the control of the partial pressure of the organosiloxane is performed by changing a flow rate of the raw material of organosiloxane.

16. The manufacturing method of a semiconductor device as recited in claim 1, wherein an addition gas is supplied to the reaction chamber.

17. The manufacturing method of a semiconductor device as recited in claim 16, wherein the addition gas comprises at least one of $O_2$ and $CO_2$.

18. The manufacturing method of a semiconductor device as recited in claim 16, wherein the addition gas comprises at least one of $N_2O$, $H_2O$, and $SiH_4$.

19. The manufacturing method of a semiconductor device as recited in claim 16, wherein the addition gas comprises at least one of methanol, ethanol, propanol, and isopropanol.

20. The manufacturing method of a semiconductor device as recited in claim 16, wherein the addition gas comprises at least one of ethylene, acetylene, cyclohexane, benzene, trimethylbenzene, and naphthalene.

21. The manufacturing method of a semiconductor device as recited in claim 1, wherein
  an applied power is varied in synchronism with the variation of the volume ratio of the organosiloxane and the inert gas.

22. A manufacturing method of a semiconductor device having at least one circuit element formed in a semiconductor substrate or a semiconductor layer and a multilayer interconnection structure formed on the semiconductor substrate or the semiconductor layer in a state in which the multilayer interconnection structure is electrically connected to the at least one circuit element, the semiconductor device having an multilayer interconnection formed by stacking plural unit interconnection structures each of which has an interconnection and a connecting plug formed by filling metal wiring in an interconnection trench and a via hole formed in an insulating film, comprising:
  supplying at least an organosiloxane and an inert gas to a reaction chamber, forming the insulating film by a plasma vapor deposition method, and varying a volume ratio of the organosiloxane and the inert gas to be supplied during deposition to change a partial pressure of the organosiloxane in the reaction chamber; and
  forming a lower adhesion layer of an interconnection interlayer dielectric in a process to excite plasma, forming the interconnection interlayer dielectric in a process to maintain the plasma, and forming an upper adhesion layer of the interconnection interlayer dielectric in a process to extinguish the plasma.

23. A manufacturing method of a semiconductor device having at least one circuit element formed in a semiconductor substrate or a semiconductor layer and a multilayer interconnection structure formed on the semiconductor substrate or the semiconductor layer in a state in which the multilayer interconnection structure is electrically connected to the at least one circuit element, the semiconductor device having a multilayer interconnection formed by stacking plural unit interconnection structures each of which has an interconnection and a connecting plug formed by filling metal wiring in an interconnection trench and a via hole formed in an insulating film, comprising:

a process to form a via interlayer dielectric, a process to form an interconnection interlayer dielectric, and a process to form a hard mask film; and supplying at least an organosiloxane and an inert gas to a reaction chamber, forming the insulating film by a plasma vapor deposition method, and varying a volume ratio of the organosiloxane and the inert gas to be supplied during deposition to change a partial pressure of the organosiloxane in the reaction chamber; and forming the via interlayer dielectric in a process to excite plasma and forming the interconnection interlayer dielectric in a process to maintain the plasma.

24. The manufacturing method of a semiconductor device as recited in claim 23, wherein the hard mask film is formed in a process to extinguish the plasma.

25. A semiconductor device having an insulating film formed by a plasma vapor deposition method with supplying at least a raw material of organosiloxane and an inert gas to a reaction chamber, wherein:

the insulating film comprises a porous insulating film formed by a partial pressure control with varying a volume ratio of the raw material of organosiloxane and the inert gas during deposition, the porous film including a plurality of layers having different film characteristics wherein the porous insulating film comprises an insulating film and a film density near an interface of at least one of an upper layer and a lower layer of the insulating film is higher than that of an interior of the film and varies continuously.

26. The semiconductor device as recited in claim 25, wherein the porous insulating film comprises an insulating film including a cyclic organosiloxane structure containing at least silicon, oxygen, hydrogen, and carbon as component elements.

27. The semiconductor device as recited in claim 25, wherein an amount of carbon near an interface of at least one of an upper layer and a lower layer of the porous insulating film is smaller than that of an interior of the film and varies continuously.

28. The semiconductor device as recited in claim 25, wherein a hydrogen content near an interface of at least one of an upper layer and a lower layer of the porous insulating film is lower than that of an interior of the film and varies continuously.

29. The semiconductor device as recited in claim 25, wherein:

the insulating film comprises an interconnection interlayer dielectric and a via interlayer dielectric;

both of the interconnection interlayer dielectric and the via interlayer dielectric include at least silicon, oxygen, carbon, and hydrogen; and an amount of oxygen in the interconnection interlayer dielectric is smaller than that in the via interlayer dielectric.

30. The semiconductor device as recited in claim 25, wherein:

the insulating film comprises an interconnection interlayer dielectric and a via interlayer dielectric;

both of the interconnection interlayer dielectric and the via interlayer dielectric include at least silicon, oxygen, carbon, and hydrogen; and an amount of carbon in the interconnection interlayer dielectric is larger than that in the via interlayer dielectric.

31. The semiconductor device as recited in claim 25, wherein:

the insulating film comprises an interconnection interlayer dielectric and a via interlayer dielectric;

both of the interconnection interlayer dielectric and the via interlayer dielectric include at least silicon, oxygen, carbon, and hydrogen; and a density of the interconnection interlayer dielectric is lower than that of the via interlayer dielectric.

32. The semiconductor device as recited in claim 25, wherein:

the insulating film comprises an interconnection interlayer dielectric and a via interlayer dielectric; and the via interlayer dielectric comprises an SiOCH film.

33. The semiconductor device as recited in claim 25, wherein:

the insulating film comprises an interconnection interlayer dielectric; and a hard mask film of an SiOCH film is provided above the interconnection interlayer dielectric.

* * * * *